United States Patent
Sato

(10) Patent No.: US 11,722,113 B2
(45) Date of Patent: Aug. 8, 2023

(54) MULTILAYERED LOW-PASS FILTER

(71) Applicant: TDK CORPORATION, Tokyo (JP)

(72) Inventor: Takuya Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/697,520

(22) Filed: Mar. 17, 2022

(65) Prior Publication Data

US 2022/0311407 A1    Sep. 29, 2022

(30) Foreign Application Priority Data

Mar. 23, 2021   (JP) .................. 2021-048850

(51) Int. Cl.
| | |
|---|---|
| *H03H 7/01* | (2006.01) |
| *H01F 27/28* | (2006.01) |
| *H01G 4/30* | (2006.01) |
| *H01G 4/40* | (2006.01) |
| *H01F 27/40* | (2006.01) |
| *H03H 1/00* | (2006.01) |

(52) U.S. Cl.
CPC ....... *H03H 7/0115* (2013.01); *H01F 27/2804* (2013.01); *H01F 27/40* (2013.01); *H01G 4/30* (2013.01); *H01G 4/40* (2013.01); *H01F 2027/2809* (2013.01); *H03H 2001/0085* (2013.01)

(58) Field of Classification Search
CPC .......... H03H 2001/0085; H03H 7/0115; H01F 27/2804
USPC .................................................. 333/175, 185
See application file for complete search history.

(56) References Cited

U.S. PATENT DOCUMENTS

2008/0180192 A1    7/2008  Sakisaka et al.
2018/0102752 A1*   4/2018  Kishimoto ............ H01P 1/2002

* cited by examiner

*Primary Examiner* — Rakesh B Patel
(74) *Attorney, Agent, or Firm* — Oliff PLC

(57) ABSTRACT

A low-pass filter includes first to third inductors and a capacitor. A first inductor-forming conductor layer constituting at least a part of each of the first and second inductors and a second inductor-forming conductor layer including first and second portions constituting first and second inductor portions of the third inductor are connected by a plurality of first through holes. The first portion and a capacitor-forming conductor layer constituting a part of the capacitor are connected by a plurality of second through holes. The second portion and the capacitor-forming conductor layer are connected by a plurality of third through holes.

11 Claims, 19 Drawing Sheets

MULTILAYERED LOW-PASS FILTER

BACKGROUND OF THE INVENTION

1. Field of the Invention

The present invention relates to a multilayered low-pass filter including an inductor and a capacitor integrated using a stack.

2. Description of the Related Art

The recent market demands for reductions in size and footprint of the compact mobile communication apparatuses have also required miniaturization of low-pass filters for use in those communication apparatus. Among known low-pass filters suited for miniaturization are ones that use a stack of dielectric layers and conductor layers.

US 2008-0180192 A1 discloses a multilayered low-pass filter. The multilayered low-pass filter includes two inductors connected in series and a capacitor provided between a connection point of the two inductors and the ground. The connection point of the two inductors and a conductor layer constituting the capacitor are connected by through holes.

Low-pass filters desirably have the characteristics that its passband has sufficiently low insertion loss and sufficiently high return loss, and its stopband has sufficiently high insertion loss. In the multilayered low-pass filter disclosed in US 2008/0180192 A1, the magnitude of the insertion loss in the stopband can be adjusted, for example, by adjusting the inductance of a path connecting the connection point of the two inductors to the capacitor. This path is composed of through holes.

Systems using signals of higher frequency than heretofore have recently been employed for compact mobile communication apparatuses. The use of signals having a higher frequency than heretofore requires low-pass filters to satisfy stricter characteristics than heretofore. For example, sufficiently high insertion loss is demanded in a higher stopband than heretofore. However, the multilayered low-pass filter disclosed in US 2008/0180192 A1 has had the problem that the inductance of the path connecting the connection point of the two inductors to the capacitor is not sufficiently adjustable, resulting in the magnitude of the insertion loss in the stopband being unable to be sufficiently adjusted.

SUMMARY OF THE INVENTION

An object of the present invention is to provide a multilayered low-pass filter in which the magnitude of insertion loss in a stopband can be sufficiently adjusted.

A multilayered low-pass filter according to the present invention includes a first inductor and a second inductor connected in series, a third inductor provided between a connection point of the first inductor with the second inductor and a ground in a circuit configuration, a capacitor connected to the third inductor, and a stack including a plurality of dielectric layers and a plurality of conductor layers stacked together. The stack is intended to integrate the first inductor, the second inductor, the third inductor, and the capacitor. The third inductor includes a first inductor portion and a second inductor portion connected in parallel.

The plurality of conductor layers include a first inductor-forming conductor layer, a second inductor-forming conductor layer, and a capacitor-forming conductor layer located at different positions, respectively, in a stacking direction of the plurality of dielectric layers. The first inductor-forming conductor layer constitutes at least a part of each of the first and second inductors. The second inductor-forming conductor layer includes a first portion constituting the first inductor portion and a second portion constituting the first inductor portion. The capacitor-forming conductor layer constitutes a part of the capacitor.

The stack further includes at least one first through hole connecting the first inductor-forming conductor layer and the second inductor-forming conductor layer, at least one second through hole connecting the first portion of the second inductor-forming conductor layer and the capacitor-forming conductor layer, and at least one third through hole connecting the second portion of the second inductor-forming conductor layer and the capacitor-forming conductor layer.

In the multilayered low-pass filter according to the present invention, the third inductor may further include a third inductor portion provided between the connection point and the first and second inductor portions in the circuit configuration. The third inductor portion may include the at least one first through hole.

In the multilayered low-pass filter according to the present invention, the at least one first through hole may include a plurality of first through holes connected in series.

In the multilayered low-pass filter according to the present invention, the second inductor-forming conductor layer may have a rotationally symmetric shape about a connecting portion of the second inductor-forming conductor layer and the at least one first through hole when seen in one direction parallel to the stacking direction. In such a case, the at least one second through hole and the at least one third through hole may be located symmetrically about the connecting portion when seen in the one direction parallel to the stacking direction.

In the multilayered low-pass filter according to the present invention, the second inductor-forming conductor layer may have an axisymmetric shape about an axis of symmetry passing through the connecting portion of the second inductor-forming conductor layer and the at least one first through hole when seen in one direction parallel to the stacking direction, the axis of symmetry being orthogonal to the stacking direction. In such a case, the at least one second through hole and the at least one third through hole may be located symmetrically about the connecting portion when seen in the one direction parallel to the stacking direction.

In the multilayered low-pass filter according to the present invention, the first inductor-forming conductor layer may have a rotationally symmetric shape about a connecting portion of the first inductor-forming conductor layer and the at least one first through hole when seen in one direction parallel to the stacking direction. Alternatively, the first inductor-forming conductor layer may have an axisymmetric shape about an axis of symmetry passing through a connecting portion of the first inductor-forming conductor layer and the at least one first through hole when seen in one direction parallel to the stacking direction, the axis of symmetry being orthogonal to the stacking direction.

In the multilayered low-pass filter according to the present invention, each of the conductor layers may have a shape to match itself or another conductor layer when rotated about a center axis intersecting the at least one first through hole, the center axis being parallel to the stacking direction. In such a case, the stack may further include a plurality of through holes including the at least one first through hole, the at least one second through hole, and the at least one third through hole. Each of the plurality of through holes may be located at a position to match itself or another through hole when seen in one direction parallel to the stacking direction and rotated about the center axis.

In the multilayered low-pass filter according to the present invention, the plurality of conductor layers include the first inductor-forming conductor layer, the second inductor-forming conductor layer, and the capacitor-forming conductor layer located at different positions, respectively, in the stacking direction of the plurality of dielectric layers. The first inductor-forming conductor layer constitutes at least a part of each of the first and second inductors. The second inductor-forming conductor layer includes the first portion constituting the first inductor portion and the second portion constituting the first inductor portion. The capacitor-forming conductor layer constitutes a part of the capacitor. The stack includes the at least one first through hole connecting the first inductor-forming conductor layer and the second inductor-forming conductor layer, the at least one second through hole connecting the first portion of the second inductor-forming conductor layer and the capacitor-forming conductor layer, and the at least one third through hole connecting the second portion of the second inductor-forming conductor layer and the capacitor-forming conductor layer. According to the present invention, the magnitude of insertion loss in the stopband can thus be sufficiently adjusted.

Other and further objects, features and advantages of the present invention will appear more fully from the following description.

DETAILED DESCRIPTION OF THE PREFERRED EMBODIMENTS

First Embodiment

Figure 1:
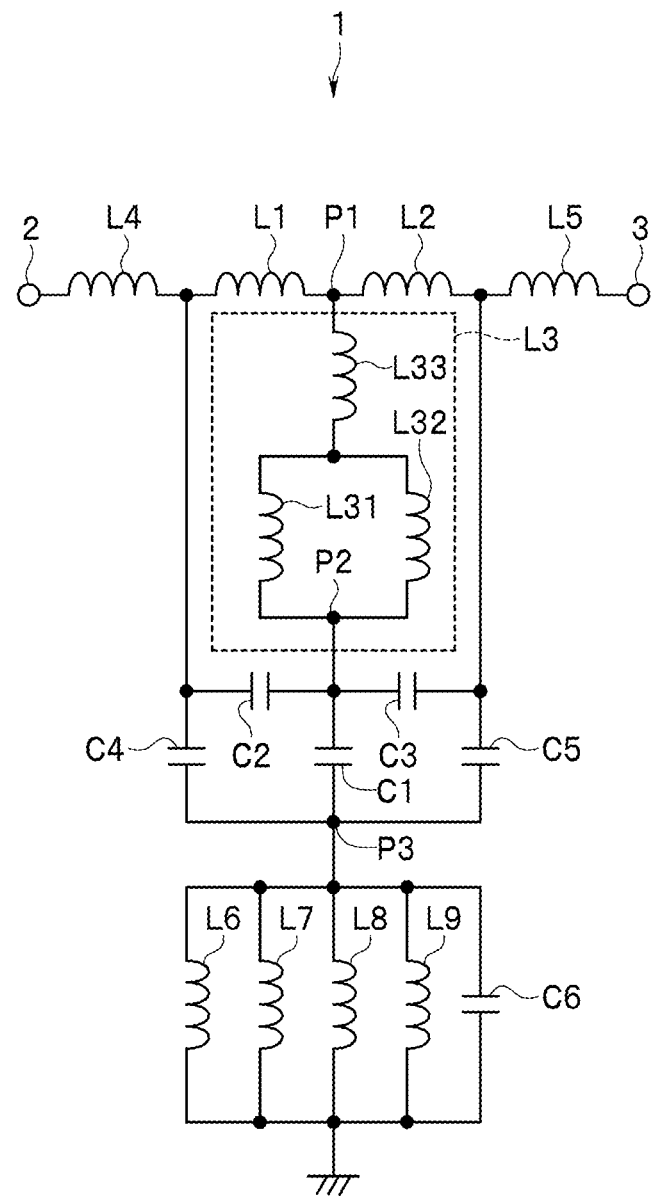
FIG. 1 is a circuit diagram showing a circuit configuration of a multilayered low-pass filter according to a first embodiment of the invention.

Embodiments of the present invention will now be described in detail with reference to the drawings. First, a configuration of a multilayered low-pass filter (hereinafter simply referred to as low-pass filter) 1 according to a first embodiment of the invention will be outlined with reference to FIG. 1. The low-pass filter 1 includes at least a first inductor L1, a second inductor L2, a third inductor L3, and a capacitor. The first and second inductors L1 and L2 are connected in series. The third inductor L3 is provided between a connection point P1 of the first inductor L1 with the second inductor L2 and a ground in a circuit configuration. The capacitor is connected to the third inductor. In the present application, the expression of "in the (a) circuit configuration" is used to indicate not layout in physical configuration but layout in the circuit diagram.

The third inductor L3 includes a first inductor portion L31 and a second inductor portion L32 connected in parallel, and a third inductor portion L33. The third inductor portion L33 is provided between the connection point P1 of the first inductor L1 with the second inductor L2 and the first and second inductor portions L31 and L32 in the circuit configuration. The third inductor portion L33 is connected to each of the first and second inductor portions L31 and L32 in series.

Next, an example of a configuration of the portions of the low-pass filter 1 other than the first to third inductors L1 to L3 will be described with reference to FIG. 1.

The low-pass filter 1 includes capacitors C1, C2, and C3 as the foregoing capacitor. The low-pass filter 1 further includes a first input/output port 2, a second input/output port 3, inductors L4, L5, L6, L7, L8, and L9, and capacitors C4, C5, and C6.

One end of the inductor L4 is connected to the first input/output port 2. One end of the first inductor L1 is connected to the other end of the inductor L4. One end of the second inductor L2 is connected to the other end of the first inductor L1. One end of the inductor L5 is connected to the other end of the second inductor L2. The other end of the inductor L5 is connected to the second input/output port 3. The first and second inductors L1 and L2 are provided in series in a path connecting the first input/output port 2 and the second input/output port 3.

One end of the third inductor portion L33 of the third inductor L3 is connected to the connection point P1 of the first inductor L1 with the second inductor L2. One end of each of the first and second inductor portions L31 and L32 of the third inductor L3 is connected to the other end of the third inductor portion L33. The other ends of the first and second inductor portions L31 and L32 are connected to each other.

One end of each of the capacitors C1 to C3 is connected to a connection point P2 of the other end of the first inductor portion L31 with the other end of the second inductor portion L32. The other end of the capacitor C2 and one end of the capacitor C4 are connected to a connection point of the first inductor L1 with the inductor L4. The other end of the capacitor C3 and one end of the capacitor C5 are connected to a connection point of the second inductor L2 with the inductor L5. The other ends of the capacitors C1, C4, and C5 are connected to each other.

One end of each of the inductors L6 to L9 and the capacitor C6 is connected to a connection point P3 of the other ends of the capacitors C1, C4, and C5. The other ends of the inductors L6 to L9 and the capacitor C6 are connected to the ground.

Figure 2:
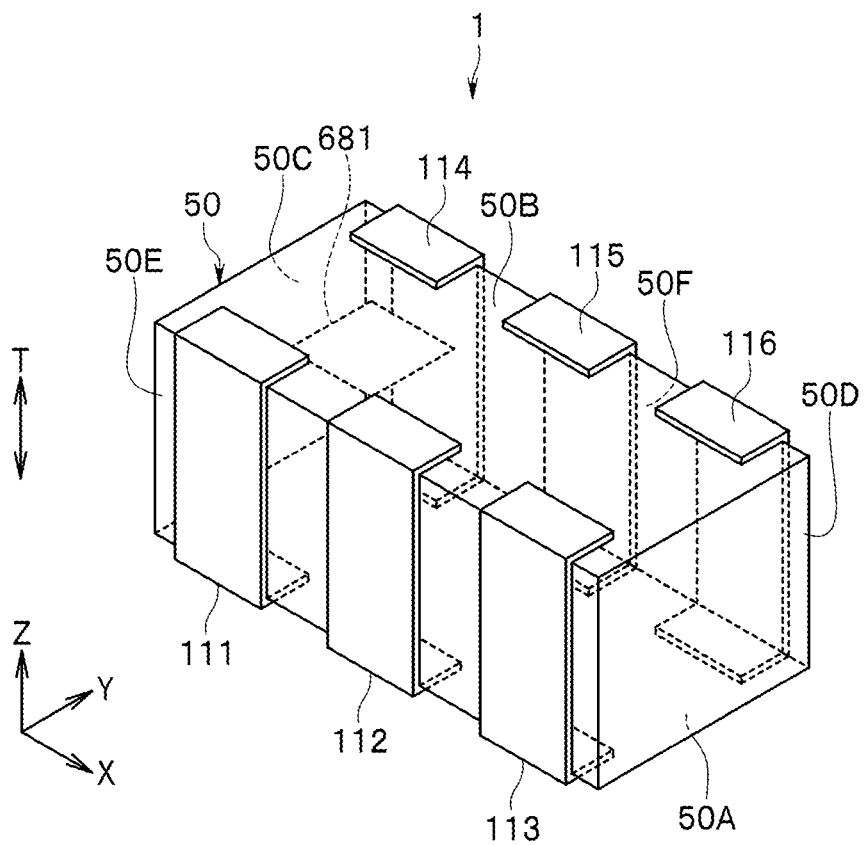
FIG. 2 is a perspective view showing an appearance of the multilayered low-pass filter according to the first embodiment of the invention.

Next, other configurations of the low-pass filter 1 will be described with reference to FIG. 2. FIG. 2 is a perspective view showing an appearance of the low-pass filter 1.

The low-pass filter 1 further includes a stack 50 including a plurality dielectric layers and a plurality of conductor layers stacked together, and a plurality of through holes. The stack 50 is intended to integrate the first input/output port 2, the second input/output port 3, the first to third inductors L1 to L3, the inductors L4 to L9, and the capacitors C1 to C6. The first to third inductors L1 to L3, the inductors L4 to L9, and the capacitors C1 to C6 are formed using the plurality of conductor layers.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 50F are perpendicular to the top surface 50B and the bottom surface 50A.

Here, X, Y, and Z directions are defined as shown in FIG. 2. The X, Y, and Z directions are orthogonal to one another. In the present embodiment, a direction parallel to the stacking direction T will be referred to as the Z direction. The opposite directions to the X, Y, and Z directions are defined as —X, —Y, and —Z directions, respectively.

As shown in FIG. 2, the bottom surface 50A is located at the end of the stack 50 in the —Z direction. The top surface 50B is located at the end of the stack 50 in the Z direction. The bottom surface 50A and the top surface 50B each have a rectangular shape extending in the X direction. The side surface 50C is located at the end of the stack 50 in the —X direction. The side surface 50D is located at the end of the stack 50 in the X direction. The side surface 50E is located at the end of the stack 50 in the —Y direction. The side surface 501F is located at the end of the stack 50 in the Y direction.

The low-pass filter 1 further includes terminals 111, 112, 113, 114, 115, and 116. Each of the terminals 111 to 113 is disposed to extend from the top surface 50B to the bottom surface 50A via the side surface 50E. The terminals 111 to 113 are arranged in this order in the X direction. Each of the terminals 114 to 116 is disposed to extend from the top surface SOB to the bottom surface 50A via the side surface 50F. The terminals 114 to 116 are arranged in this order in the X direction.

The terminal 112 corresponds to the first input/output port 2, and the terminal 115 to the second input/output port 3. Each of the terminals 111, 113, 114, and 116 is connected to the ground.

Next, an example of the plurality of dielectric layers and the plurality of conductor layers constituting the stack 50 will be described with reference to FIGS. 3A to 7B. In this example, the stack 50 includes eighteen dielectric layers stacked together. The eighteen dielectric layers will be referred to as a first to an eighteenth dielectric layer in the order from bottom to top. The first to eighteenth dielectric layers are denoted by reference numerals 51 to 68, respectively.

Figure 3A:
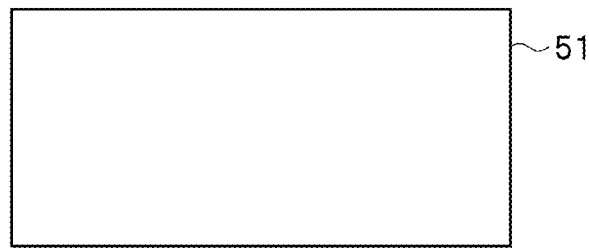
FIG. 3A to FIG. 3C are explanatory diagrams showing respective patterned surfaces of first to third dielectric layers of a stack of the multilayered low-pass filter according to the first embodiment of the invention.

FIG. 3A shows the patterned surface of the first dielectric layer 51. No conductor layers or through holes are formed on/in the dielectric layer 51.

Figure 3B:
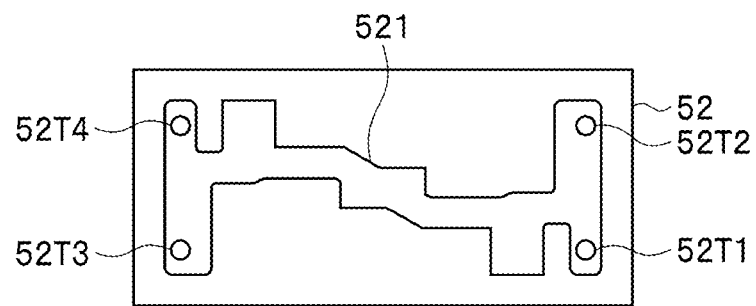

FIG. 3B shows the patterned surface of the second dielectric layer 52. A capacitor-forming conductor layer 521 is formed on the patterned surface of the dielectric layer 52. Further, through holes 52T1, 52T2, 52T3, and 52T4 are formed in the dielectric layer 52. The through holes 52T1 to 52T4 are connected to the conductor layer 521.

Figure 3C:
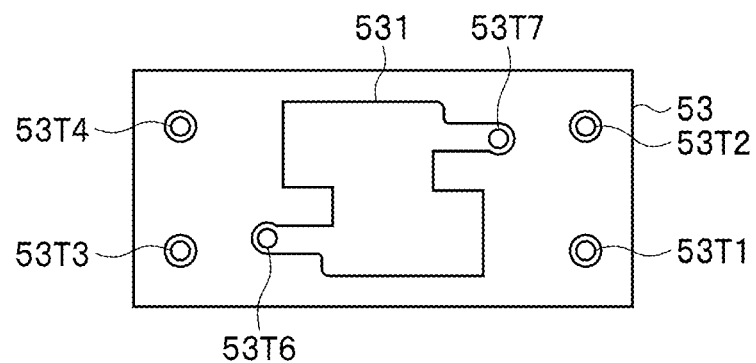

FIG. 3C shows the patterned surface of the third dielectric layer 53. A capacitor-forming conductor layer 531 is formed on the patterned surface of the dielectric layer 53. Further, through holes 53T1, 53T2, 53T3, 53T4, 53T6, and 53T7 are formed in the dielectric layer 53. The through holes 52T1 to 52T4 formed in the dielectric layer 52 are connected to the through holes 53T1 to 53T4, respectively. The through holes 53T6 and 53T7 are connected to the conductor layer 531.

Figure 4A:
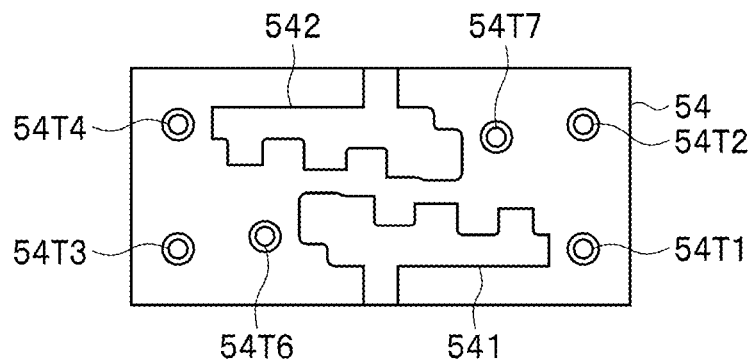
FIG. 4A and FIG. 4B are explanatory diagrams showing respective patterned surfaces of fourth and fifth dielectric layers of the stack of the multilayered low-pass filter according to the first embodiment of the invention.

FIG. 4A shows the patterned surface of the fourth dielectric layer 54. Capacitor-forming conductor layers 541 and 542 are formed on the patterned surface of the dielectric layer 54. The conductor layer 541 is connected to the terminal 112 (see FIG. 2). The conductor layer 542 is connected to the terminal 115 (see FIG. 2). Further, through holes 54T1, 54T2, 54T3, 54T4, 54T6, and 54T7 are formed in the dielectric layer 54. The through holes 53T1 to 53T4, 53T6, and 53T7 formed in the dielectric layer 53 are connected to the through holes 54T1 to 54T4, 54T6, and 54T7, respectively.

Figure 4B:
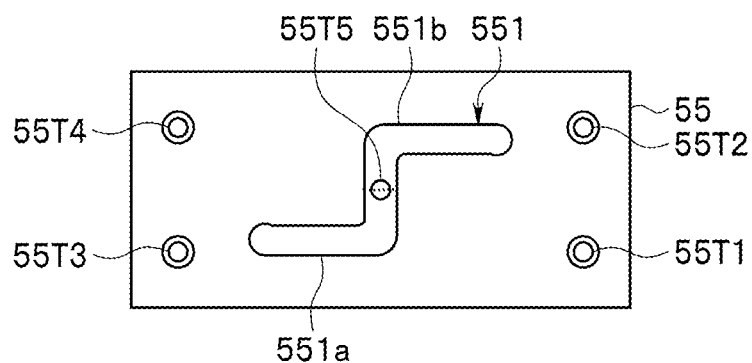

FIG. 4B shows the patterned surface of the fifth dielectric layer 55. A second inductor-forming conductor layer 551 is formed on the patterned surface of the dielectric layer 55. The second inductor-forming conductor layer 551 includes a first portion 551a and a second portion 551b. Each of the first and second portions 551a and 551b has a first end and a second end located opposite to each other. The first end of the first portion 551a and the first end of the second portion 551b are connected to each other. In FIG. 4B, the border between the first portion 551a and the second portion 551b is shown by a dotted line. The through hole 54T6 formed in the dielectric layer 54 is connected to a portion of the first portion 551a near the second end thereof. The through hole 54T7 formed in the dielectric layer 54 is connected to a portion of the second portion 551b near the second end thereof.

Further, through holes 55T1, 55T2, 55T3, 55T4, and 55T5 are formed in the dielectric layer 55. The through holes 54T1 to 54T4 formed in the dielectric layer 54 are connected to the through holes 55T1 to 55T4, respectively. The through hole 55T5 is connected to the first portion 551a and the second portion 551b at and near the border between the first portion 551a and the second portion 551b.

Figure 4C:
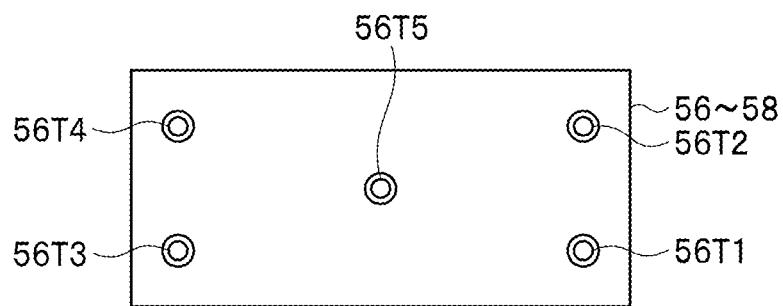
FIG. 4C is an explanatory diagram showing a patterned surface of each of sixth to eighth dielectric layers of the stack of the multilayered low-pass filter according to the first embodiment of the invention.

FIG. 4C shows a patterned surface of each of the sixth to eighth dielectric layers 56 to 58. In each of the dielectric layers 56 to 58, there are formed through holes 56T1, 56T2, 56T3, 56T4, and 56T5. The through holes 55T1 to 55T5 formed in the dielectric layer 55 are connected to the through holes 56T1 to 56T5 formed in the dielectric layer 56, respectively. In the dielectric layers 56 to 58, every vertically adjacent through holes denoted by the same reference signs are connected to each other.

Figure 5A:
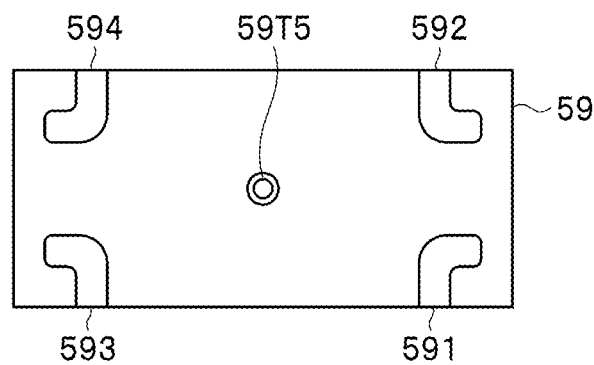
FIG. 5A is an explanatory diagram showing a patterned surface of a ninth dielectric layer of the stack of the multilayered low-pass filter according to the first embodiment of the invention.

FIG. 5A shows the patterned surface of the ninth dielectric layer 59. Conductor layers 591, 592, 593, and 594 are formed on the patterned surface of the dielectric layer 59. The conductor layers 591, 592, 593, and 594 are connected to the terminals 111, 114, 113, and 116 (see FIG. 2), respectively. The through holes 56T1 to 56T4 formed in the dielectric layer 58 are connected to the conductor layers 591 to 594, respectively. Further, a through hole 59T5 is formed in the dielectric layer 59. The through hole 56T5 formed in the dielectric layer 58 is connected to the through hole 59T5.

Figure 5B:
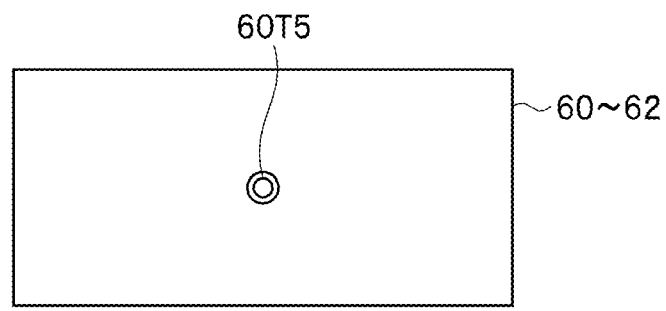
FIG. 5B is an explanatory diagram showing a patterned surface of each of tenth to twelfth dielectric layers of the stack of the multilayered low-pass filter according to the first embodiment of the invention.

FIG. 5B shows a patterned surface of each of the tenth to twelfth dielectric layers 60 to 62. In each of the dielectric layers 60 to 62, there is formed a through hole 60T5. The through hole 59T5 formed in the dielectric layer 59 is connected to the through hole 60T5 in the dielectric layer 60. The vertically adjoining through holes 60T5 in the dielectric layers 60 to 62 are connected to each other.

Figure 5C:
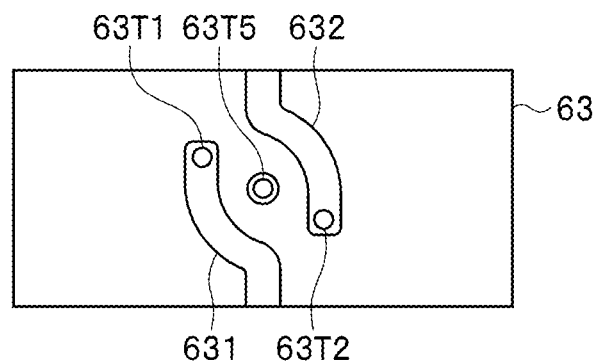
FIG. 5C is an explanatory diagram showing a patterned surface of a thirteenth dielectric layer of the stack of the multilayered low-pass filter according to the first embodiment of the invention.

FIG. 5C shows the patterned surface of the thirteenth dielectric layer 63. Inductor-forming conductor layers 631 and 632 are formed on the patterned surface of the dielectric layer 63. Each of the conductor layers 631 and 632 has a first end and a second end opposite to each other. The first end of the conductor layer 631 is connected to the terminal 112 (see FIG. 2). The first end of the conductor layer 632 is connected to the terminal 115 (see FIG. 2). Further, through holes 63T1, 63T2, and 63T5 are formed in the dielectric layer 63. The through hole 63T1 is connected to a portion of the conductor layer 631 near the second end thereof. The through hole 63T2 is connected to a portion of the conductor layer 632 near the second end thereof. The through hole 60T5 formed in the dielectric layer 62 is connected to the through hole 63T5.

Figure 6A:
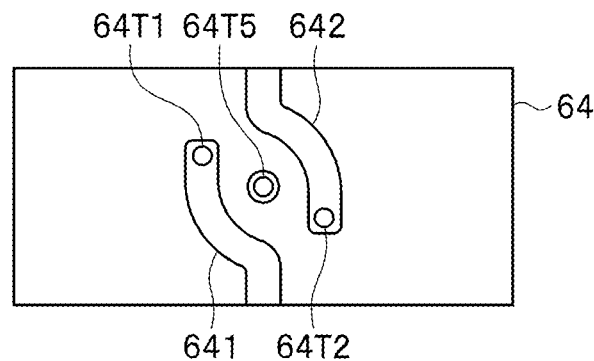
FIG. 6A to FIG. 6C are explanatory diagrams showing respective patterned surfaces of fourteenth to sixteenth dielectric layers of the stack of the multilayered low-pass filter according to the first embodiment of the invention.
Figure 6B:
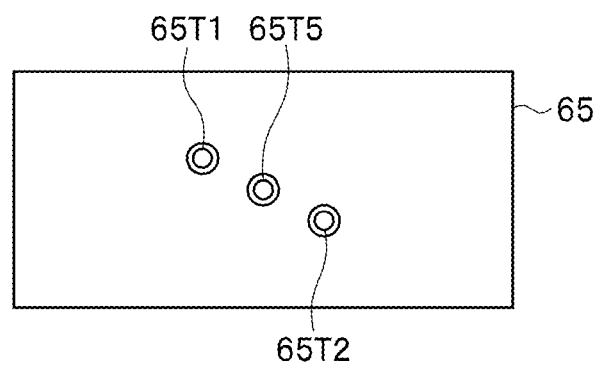

FIG. 6A shows the patterned surface of the fourteenth dielectric layer 64. Inductor-forming conductor layers 641 and 642 are formed on the patterned surface of the dielectric layer 64. Each of the conductor layers 641 and 642 has a first end and a second end opposite to each other. The first end of the conductor layer 641 is connected to the terminal 112 (see FIG. 2). The first end of the conductor layer 642 is connected to the terminal 115 (see FIG. 2). Further, through holes 64T1, 64T2, and 64T5 are formed in the dielectric layer 64. The through hole 63T1 formed in the dielectric layer 63 and the through hole 64T1 are connected to a portion of the conductor layer 641 near the second end thereof. The through hole 63T2 formed in the dielectric layer 63 and through hole 64T2 are connected to a portion of the conductor layer 642 near the second end thereof. The through hole 63T5 formed in the dielectric layer 63 is connected to the through hole 64T5.

FIG. 69 shows the patterned surface of the fifteenth dielectric layer 65. Through holes 65T1, 65T2, and 65T5 are formed in the dielectric layer 65. The through holes 64T1, 64T2, and 64T5 formed in the dielectric layer 54 are connected to the through holes 65T1, 65T2, and 65T5, respectively.

Figure 6C:
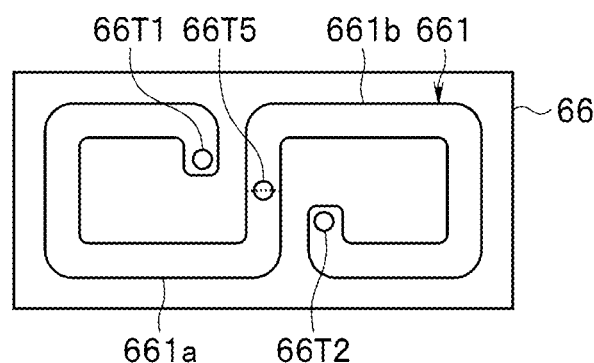

FIG. 6C shows the patterned surface of the sixteenth dielectric layer 66. A first inductor-forming conductor layer 661 is formed on the patterned surface of the dielectric layer 66. The first inductor-forming conductor layer 661 includes a first portion 661a and a second portion 661b. Each of the first and second portions 661a and 661b has a first end and a second end located opposite to each other. The first end of the first portion 661a and the first end of the second portion 661b are connected to each other. In FIG. 6C, the border between the first portion 661a and the second portion 661b is shown by a dotted line.

Further, through holes 66T1, 66T2, and 66T5 are formed in the dielectric layer 66. The through hole 65T1 formed in the dielectric layer 65 and the through hole 66T1 are connected to a portion of the first portion 661a near the second end thereof. The through hole 65T2 formed in the dielectric layer 65 and the through hole 66T2 are connected to a portion of the second portion 661b near the second end thereof. The through hole 65T5 formed in the dielectric layer 65 and the through hole 66T5 are connected to the first portion 661a and the second portion 661b at and near the border between the first portion 661a and the second portion 661b.

Figure 7A:
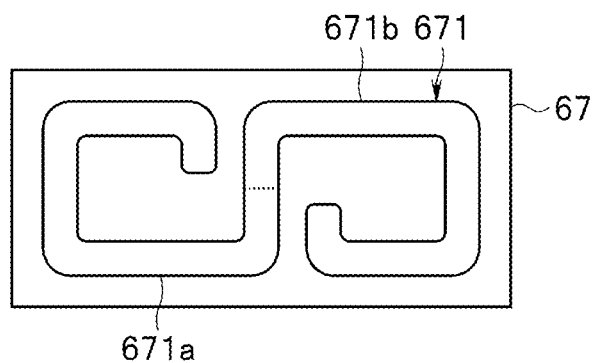
FIG. 7A and FIG. 7B are explanatory diagrams showing respective patterned surfaces of seventeenth and eighteenth dielectric layers of the stack of the multilayered low-pass filter according to the first embodiment of the invention.

FIG. 7A shows the patterned surface of the seventeenth dielectric layer 67. A first inductor-forming conductor layer 671 is formed on the patterned surface of the dielectric layer 67. The first inductor-forming conductor layer 671 includes a first portion 671a and a second portion 671b. Each of the first and second portions 671a and 671b has a first end and a second end located opposite to each other. The first end of the first portion 671a and the first end of the second portion 671b are connected to each other. In FIG. 7A, the border between the first portion 671a and the second portion 671b is shown by a dotted line.

The through hole 66T1 formed in the dielectric layer 66 is connected to a portion of the first portion 671a near the second end thereof. The through hole 66T2 formed in the dielectric layer 66 is connected to a portion of the second portion 671b near the second end thereof. The through hole 66T5 formed in the dielectric layer 66 is connected to the first portion 671a and the second portion 671b at and near the border between the first portion 671a and the second portion 671b.

Figure 7B:
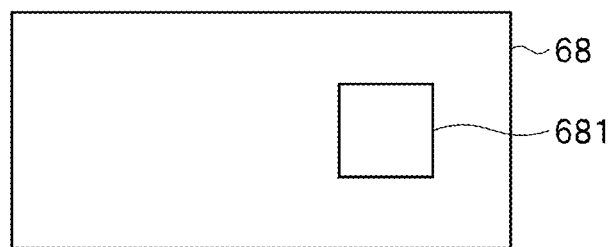

FIG. 7B shows the patterned surface of the eighteenth dielectric layer 68. A mark 681 made of a conductor layer is formed on the patterned surface of the dielectric layer 68.

The stack 50 shown in FIG. 2 is formed by stacking the first to eighteenth dielectric layers 51 to 68 such that the patterned surface of the first dielectric layer 51 serves as the bottom surface 50A of the stack 50 and the surface of the eighteenth dielectric layer 68 opposite to the patterned surface thereof serves as the top surface 50B of the stack 50.

Figure 8:
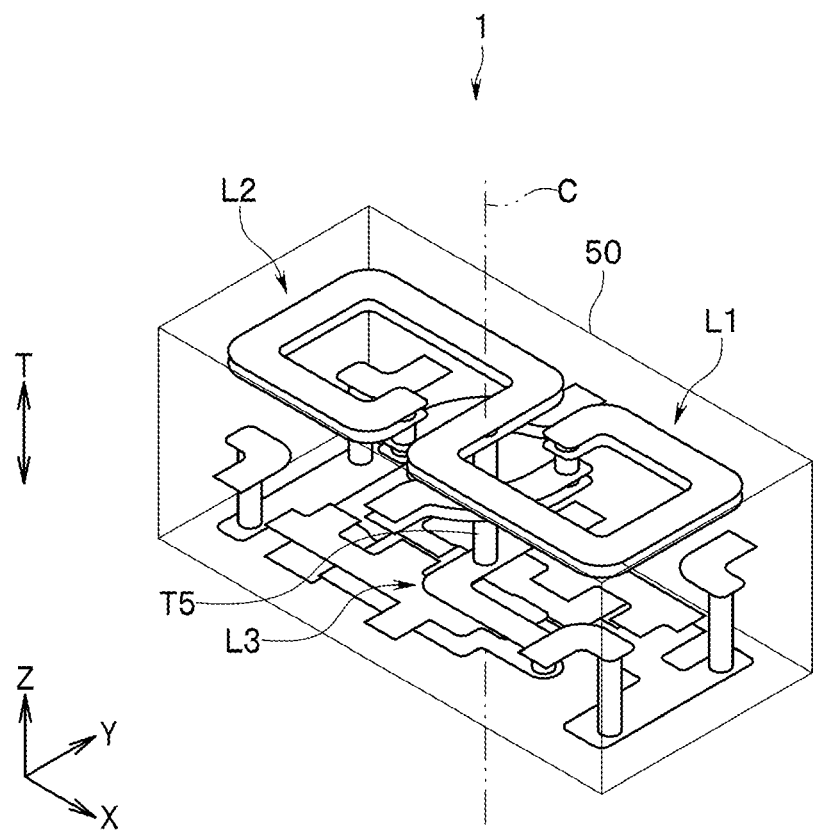
FIG. 8 is a perspective view showing an inside of the stack of the multilayered low-pass filter according to the first embodiment of the invention.
Figure 9:
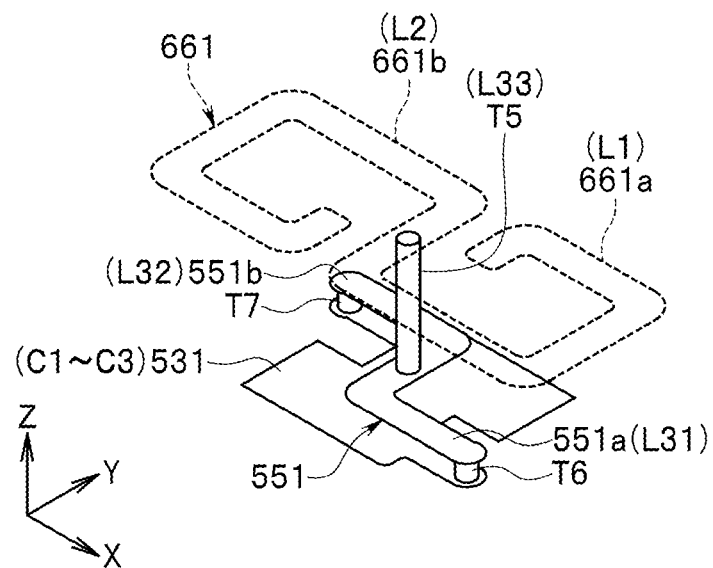
FIG. 9 is a perspective view showing a part of the inside of the stack shown in FIG. 8.

FIG. 8 shows the inside of the stack 50 formed by stacking the first to eighteenth dielectric layers 51 to 68. As shown in FIG. 8, the plurality of conductor layers and the plurality of through holes shown in FIGS. 3A to 7B are stacked inside the stack 50. In FIG. 8, the mark 681 is omitted. FIG. 9 shows a part of the inside of the stack 50 shown in FIG. 8. Specifically, FIG. 9 shows the first inductor-forming conductor layer 661, the second inductor-forming conductor layer 551, and the capacitor-forming conductor layer 531, and through holes connecting the conductor layers.

Correspondences between the circuit components of the low-pass filter 1 shown in FIG. 1 and the internal components of the stack 50 shown in FIG. 3A to FIG. 7B will now be described. The first inductor L1 is composed of the first portion 661a of the first inductor-forming conductor layer 661 shown in FIG. 6C, the first portion 671a of the first inductor-forming conductor layer 671 shown in FIG. 7A, and the through holes 66T1 and 66T5.

The second inductor L2 is composed of the second portion 661b of the first inductor-forming conductor layer 661 shown in FIG. 6C, the second portion 671b of the first inductor-forming conductor layer 671 shown in FIG. 7A, and the through holes 66T2 and 66T5.

The first inductor portion L31 of the third inductor L3 is composed of the first portion 551a of the conductor layer 551 shown in FIG. 4B. The second inductor portion L32 of the third inductor L3 is composed of the second portion 551b of the conductor layer 551 shown in FIG. 4B. The third inductor portion L33 of the third inductor L3 is composed of the through holes 5515, 56T5, 5915, 6015, 6315, 64T5, and 65T5 shown in FIGS. 4B to 6B.

The inductor L4 is composed of the inductor-forming conductor layers 631 and 641 shown in FIG. 5C and FIG. 6A and the through hole 63I1. The inductor L5 is composed of the inductor-forming conductor layers 632 and 642 shown in FIG. 5C and FIG. 6A and the through hole 63I2.

The inductor L6 is composed of the conductor layer 591 shown in FIG. 5A and the through holes 52T1, 5311, 5411, 5511, and 56/1 shown in FIG. 3B to FIG. 4C. The inductor L7 is composed of the conductor layer 592 shown in FIG. 5A and the through holes 5212, 5312, 5412, 5512, and 5612 shown in FIG. 3B to FIG. 4C. The inductor L8 is composed of the conductor layer 593 shown in FIG. 5A and the through holes 52T3, 5313, 5413, 5513, and 5613 shown in FIG. 3B to FIG. 4C. The inductor L9 is composed of the conductor layer 594 shown in FIG. 5A and the through holes 52T4, 5314, 54T4, 55T4, and 5614 shown in FIG. 3B to FIG. 4C.

The capacitor C1 is composed of the capacitor-forming conductor layers 521 and 531 shown in FIG. 3B and FIG. 3C, and the dielectric layer 52 interposed between those conductor layers.

The capacitor C2 is composed of the capacitor-forming conductor layers 531 and 541 shown in FIG. 3C and FIG. 4A, and the dielectric layer 53 interposed between those conductor layers. The capacitor C3 is composed of the capacitor-forming conductor layers 531 and 542 shown in FIG. 3C and FIG. 4A, and the dielectric layer 53 interposed between those conductor layers.

The capacitor C4 is composed of the capacitor-forming conductor layers 521 and 541 shown in FIG. 3B and FIG. 4A, and the dielectric layers 52 and 53 each interposed between those conductor layers. The capacitor C5 is composed of the capacitor-forming conductor layers 521 and 542 shown in FIG. 3B and FIG. 4A, and the dielectric layers 52 and 53 each interposed between those conductor layers.

The capacitor C6 is composed of the capacitor-forming conductor layer 521 and the conductor layers 591 to 594 shown in FIGS. 3B and 5A, and the dielectric layers 52 to 58 between two of those conductor layers.

Next, structural features of the low-pass filter 1 according to the present embodiment will be described with reference to FIGS. 1 to 9. The plurality of conductor layers of the stack 50 include the first inductor-forming conductor layer 661, the second inductor-forming conductor layer 551, and the capacitor-forming conductor layer 531 located at different positions, respectively, in the stacking direction T. The first inductor-forming conductor layer 661 constitutes at least a part of each of the first and second inductors L1 and L2. The second inductor-forming conductor layer 551 includes the first portion 551a constituting a part of the first inductor portion L31, and the second portion 551b constituting a part of the second inductor portion L32. The capacitor-forming conductor layer 531 constitutes a part of each of the capacitors C1 to C3.

The stack 50 includes at least one first through hole connecting the first inductor-forming conductor layer 661 and the second inductor-forming conductor layer 551. In the present embodiment, the at least one first through hole refers to the through holes 55T5, 56T5, 59T5, 60T5, 63T5, 64T5, and 65T5 connected in series. In FIG. 9, the reference numeral T5 denotes a through hole line composed of the through holes 55T5, 56T5, 59T5, 60T5, 63T5, 64T5, and 65T5. The first inductor-forming conductor layer 661 and the second inductor-forming conductor layer 551 are connected by the through hole line T5.

The stack 50 further includes at least one second through hole connecting the first portion 551a of the second inductor-forming conductor layer 551 and the capacitor-forming conductor layer 531, and at least one third through hole connecting the second portion 551b of the second inductor-forming conductor layer 551 and the capacitor-forming conductor layer 531. In the present embodiment, the at least one second through hole refers to the through holes 53T6 and 54I6 connected in series. The at least one third through hole refers to the through holes 53T7 and 54T7 connected in series. In FIG. 9, the reference numeral T6 denotes a through hole line composed of the through holes 53T6 and 54T6. The reference numeral T7 denotes a through hole line composed of the through holes 53T7 and 54T7. The first portion 551a and the capacitor-forming conductor layer 531 are connected by the through hole line T6. The second portion 551b and the capacitor-forming conductor layer 531 are connected by the through hole line T7.

In FIG. 4B, the circle denoted by the reference numeral 55T5 represents the through hole 5515 as well as the connecting portion of the second inductor-forming conductor layer 551 and the through hole 5515. The second inductor-forming conductor layer 551 has a rotationally symmetric shape about the connecting portion of the second inductor-forming conductor layer 551 and the through hole 5515 when seen in one direction (for example, the Z direction) parallel to the stacking direction T. In other words, the second inductor-forming conductor layer 551 has a shape to match itself when seen in the Z direction and rotated by 180° about a center axis that passes through the connecting portion and is parallel to the stacking direction T. The first portion 551a and the second portion 551b have a shape to match each other when seen in the Z direction and rotated by 180° about the center axis.

The through hole 54T6 connected to the first portion 551a and the through hole 5417 connected to the second portion 551b are located symmetrically about the connecting portion of the second inductor-forming conductor layer 551 and the through hole 55T5 when seen in the Z direction. Specifically, the through hole 54T6 and the through hole 54T7 are located to match each other when rotated by 180° about the center axis that passes through the connecting portion and is parallel to the stacking direction T. The through holes 54T6 and 54T7 are also located symmetrically about an imaginary plane that passes through the connecting portion and is perpendicular to the patterned surface of the dielectric layer 55.

Like the through holes 54T6 and 54T7, the through hole 53T6 connected to the through hole 54T6 and the through hole 53T7 connected to the through hole 54T7 are also located symmetrically about the connecting portion when seen in the Z direction. The through hole line T6 and the through hole line T7 are thus located symmetrically about the connecting portion.

In FIG. 6C, the circle denoted by the reference numeral 66T5 represents the through hole 66T5 as well as the connecting portion of the first inductor-forming conductor layer 661 and the through hole 66T5. The position of the connecting portion of the through hole 65T5, shown in FIG. 6B, and the first inductor-forming conductor layer 661 matches the position of the connecting portion (circle denoted by the reference numeral 66T5) of the first inductor-forming conductor layer 661 and the through hole 66T5 when seen in one direction (for example, the Z direction) parallel to the stacking direction T. The first inductor-forming conductor layer 661 has a rotationally symmetric shape about the connecting portion of the through hole 65T5 and the first inductor-forming conductor layer 661 when seen in the Z direction. In other words, the first inductor-forming conductor layer 661 has a shape to match itself when seen in the Z direction and rotated by 180° about a center axis that passes through the connecting portion and is parallel to the stacking direction T. The first portion 661a and the second portion 661b have a shape to match each other when seen in the Z direction and rotated by 180° about the center axis.

The first inductor-forming conductor layer 671 has the same shape as that of the first inductor-forming conductor layer 661. The first inductor-forming conductor layer 671 thus has a rotationally symmetric shape like that of the first inductor-forming conductor layer 661.

In FIG. 8, the straight line denoted by the symbol C represents a center axis that intersects the at least one first through hole, i.e., the through holes 55T5, 56T5, 59T5, 60T5, 63T5, 64T5, and 65T5, the center axis being parallel to the stacking direction T. When seen in the Z direction, the position of the center axis C matches each of the positions of the centers of gravity of the respective dielectric layers 51 to 68. Each of the conductor layers included in the stack 50, not limited to the first inductor-forming conductor layers 661 and 671 and the second inductor-forming conductor layer 551, has a shape to match itself or another conductor layer when seen in the Z direction and rotated by 180° about the center axis C. Each of the through holes included in the stack 50 is located to match itself or another through hole when seen in the Z direction and rotated by 180° about the center axis C.

As shown in FIGS. 3C to 4B, the capacitor-forming conductor layers 541 and 542 are interposed between the second inductor-forming conductor layer 551 and the capacitor-forming conductor layer 531. When seen in the Z direction, the second inductor-forming conductor layer 551 overlaps each of the capacitor-forming conductor layers 541 and 542.

Now, the operation and effects of the low-pass filter 1 according to the present embodiment will be described. In the low-pass filter 1 according to the present embodiment, the first inductor-forming conductor layer 661 constituting at least a part of each of the first and second inductors L1 and L2 and the second inductor-forming conductor layer 551 including the first portion 551a, which constitutes the first inductor portion L31, and the second portion 551b, which constitutes the second inductor portion L32, are connected by the through holes 55T5, 56T5, 59T5, 60T5, 63T5, 64T5, and 65T5 (through hole line T5). The first portion 551a and the capacitor-forming conductor layer 531, which constitutes a part of each of the capacitors C1 to C3, are connected by the through holes 53T6 and 54T6 (through hole line T6). The second portion 551b and the capacitor-forming conductor layer 531 are connected by the through holes 53T7 and 54T7 (through hole line T7).

In the present embodiment, the inductance of the third inductor L3 can be adjusted by adjusting the shape and length of the second inductor-forming conductor layer 551. According to the present embodiment, the magnitude of insertion loss in the stopband can thus be adjusted.

An effect of the low-pass filter 1 according to the present embodiment will now be described through comparisons with first to third comparative examples. A low-pass filter of the first comparative example wilt initially be described. The low-pass filter of the first comparative example has basically the same circuit configuration as that of the low-pass filter 1 according to the present embodiment. However, the third inductor L3 of the low-pass filter of the first comparative example does not include the two inductor portions connected in parallel.

Figure 10:
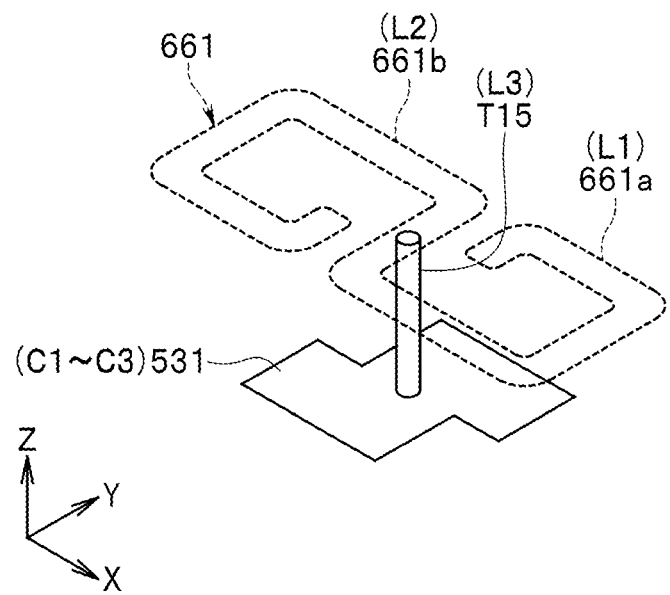
FIG. 10 is a perspective view showing a part of an inside of a stack of a multilayered low-pass filter of a first comparative example.

FIG. 10 is a perspective view showing a part of an inside of the stack of the low-pass filter of the first comparative example. The stack of the low-pass filter of the first comparative example includes a through hole line T15 that connects the first inductor-forming conductor layer 661 and the capacitor-forming conductor layer 531, instead of the second inductor-forming conductor layer 551, the through hole line T5 (through holes 55T5, 56T5, 59T5, 60T5, 63T5, 64T5, and 65T5), the through hole line T6 (through holes 5316 and 5416), and the through hole line T7 (through holes 5317 and 5417) of the present embodiment. The through hole line T15 is formed by connecting a plurality of through holes in series.

In the low-pass filter of the first comparative example, the inductance of the third inductor L3 depends on the shape of the through hole line T15. Due to limitations in the size of the stack and the layout of the first inductor-forming conductor layer 661, the shape of the through hole line T15 is not sufficiently adjustable compared to the shapes of conductor layers. In the first comparative example, the inductance of the third inductor L3 is therefore unable to be sufficiently adjusted. By contrast, according to the present embodiment, the inductance of the third inductor L3 can be sufficiently adjusted by using the second inductor-forming conductor layer 551.

Figure 11:
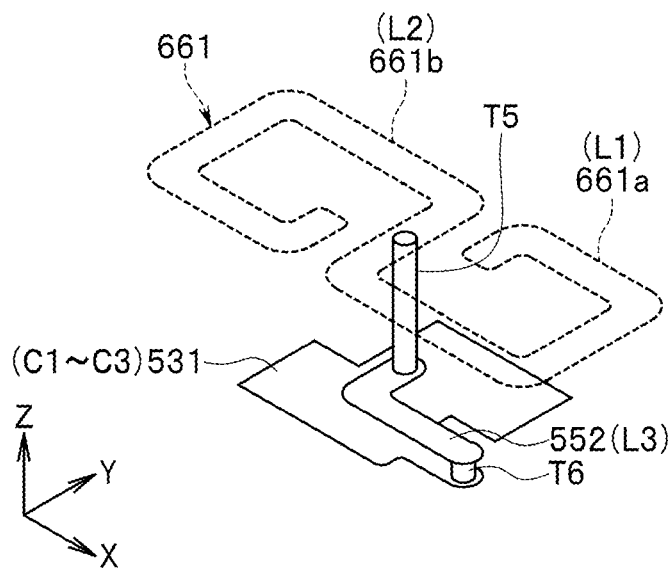
FIG. 11 is a perspective view showing a part of an inside of a stack of a multilayered low-pass filter of a second comparative example.

Next, the low-pass filter of the second comparative example will be described. The low-pass filter of the second comparative example has the same circuit configuration as that of the low-pass filter of the first comparative example. FIG. 11 is a perspective view showing a part of an inside of the stack of the low-pass filter of the second comparative example. The stack of the low-pass filter of the second comparative example includes a second inductor-forming conductor layer 552 formed on the patterned surface of the dielectric layer 55 instead of the second inductor-forming conductor layer 551 and the through hole line T7 (through holes 53T7 and 54T7) of the present embodiment. The first inductor-forming conductor layer 661 and the second inductor-forming conductor layer 552 are connected by the through hole line T5. The second inductor-forming conductor layer 552 and the capacitor-forming conductor layer 531 are connected by the through hole line T6.

In the low-pass filter of the second comparative example, the inductance of the third inductor L3 can be adjusted by adjusting the shape and length of the second inductor-forming conductor layer 552. However, in the second comparative example, the third inductor L3 and the capacitor-forming conductor layer 531 are connected by the through hole line T6. The through hole line T6 is connected near a position which is away from the center of gravity of the capacitor-forming conductor layer 531 and at which the capacitor C2 is formed. If the inductance of the third inductor L3 is adjusted by using the second inductor-forming conductor layer 552, the amount of deviation in the capacitance of the capacitor C2 formed at a position near the through hole line T6 is different from the amount of deviation in the capacitance of the capacitor C3 formed at a position away from the through hole line T6. This makes the characteristics of the low-pass filter different from the desired characteristics. According to the second comparative example, the characteristics of the low-pass filter are therefore difficult to adjust.

By contrast, in the present embodiment, the second inductor-forming conductor layer 551 and the capacitor-forming conductor layer 531 are connected by the two through hole lines T6 and T7. In particular, in the present embodiment, the second inductor-forming conductor layer 551 has the symmetric shape as described above, and the two through hole lines T6 and T7 are symmetrically located as described above. According to the present embodiment, the inductance of the third inductor L3 can thus be adjusted by using the second inductor-forming conductor layer 551 while preventing the amount of deviation in the capacitance of the capacitor C2 formed at a position near the through hole line T6 from being different from the amount of deviation in the capacitance of the capacitor C3 formed at a position near the through hole line T7.

As described above, the first portion 661a of the first inductor-forming conductor layer 661 constitutes a part of the first inductor L1, and the second portion 671b of the first inductor-forming conductor layer 671 constitutes a part of the second inductor L2. In the present embodiment, the first portion 551a of the second inductor-forming conductor layer 551 constitutes the first inductor portion 131, and the second portion 551b of the second inductor-forming conductor layer 551 constitutes the second inductor portion L32. In the second comparative example, the second inductor-forming conductor layer 552 constitutes a part of the third inductor L3.

As shown in FIG. 11, in the second comparative example, the second inductor-forming conductor layer 552 is unevenly located towards the first portion 661a side. In the second comparative example, the magnitude of the magnetic coupling between the first and third inductors L1 and L3 and the magnitude of the magnetic coupling between the second and third inductors L2 and L3 are therefore different from each other. Moreover, if the inductance of the third inductor L3 is adjusted by using the second inductor-forming conductor layer 552, the amount of deviation in the magnitude of the magnetic coupling between the first and third inductors L1 and L3 is different from the amount of deviation in the magnitude of the magnetic coupling between the second and third inductors L2 and L3. According to the second comparative example, the characteristics of the low-pass filter are therefore difficult to adjust.

By contrast, in the present embodiment, the first portion 551a is located on the first portion 661a side, and the second portion 551b is located on the second portion 661b side. The second inductor-forming conductor layer 551 is thus not unevenly located to either the first portion 661a side or the second portion 661b side. According to the present embodiment, the characteristics of the low-pass filter 1 can therefore be easier to adjust than that of the second comparative example.

Figure 12:
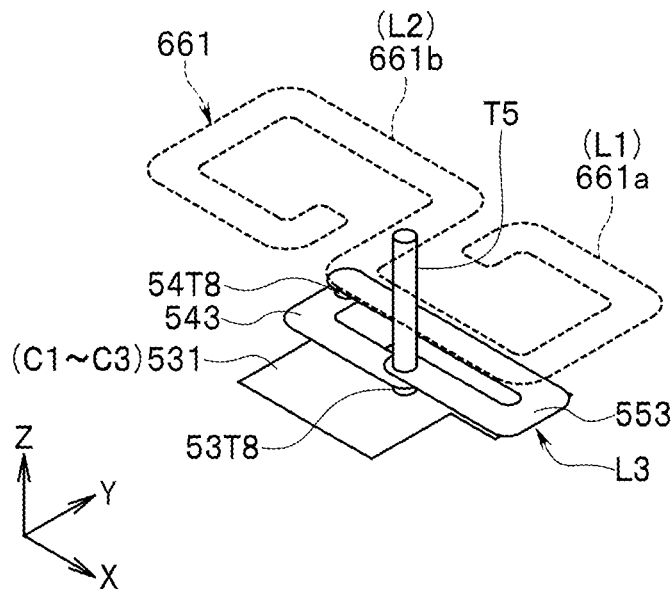
FIG. 12 is a perspective view showing a part of an inside of a stack of a multilayered low-pass filter of a third comparative example.

Next, the low-pass filter of the third comparative example will be described. The low-pass filter of the third comparative example has the same circuit configuration as that of the low-pass filter according to the first comparative example. FIG. 12 is a perspective view showing a part of an inside of the stack of the low-pass filter of the third comparative example. The stack of the low-pass filter of the third comparative example includes a second inductor-forming conductor layer 543 formed on the patterned surface of the dielectric layer 54, a second inductor-forming conductor layer 553 formed on the patterned surface of the dielectric layer 55, a through hole 53T8 formed in the dielectric layer 53, and a through hole 54T8 formed in the dielectric layer 54, instead of the second inductor-forming conductor layer 551, the through hole line T6 (through holes 53T6 and 54T6), and the through hole line T7 (through holes 53T7 and 54T7) of the present embodiment. The first inductor-forming conductor layer 661 and the second inductor-forming conductor layer 553 are connected by the through hole line T5. The second inductor-forming conductor layer 553 and the second inductor-forming conductor layer 543 are connected by the through hole 54T8. The second inductor-forming conductor layer 543 and the capacitor-forming conductor layer 531 are connected by the through hole 53T8. The through hole 53T8 is connected to the center of gravity of the capacitor-forming conductor layer 531.

Each of the first and second inductors L1 and L2 is an inductor wound around an axis in a direction parallel to the stacking direction T. In the low-pass filter of the third comparative example, an inductor wound around an axis in a direction parallel to the stacking direction T is formed of the second inductor-forming conductor layers 543 and 553 as the third inductor L3. In the third comparative example, the third inductor L3 interferes with the magnetic fields generated by the first and second inductors L1 and L2. As a result, the Q value drops.

By contrast, the present embodiment does not include a third inductor L3 that is wound as in the third comparative example. According to the present embodiment, a drop in the Q value can thus be prevented.

According to the present embodiment, the magnitude of insertion loss in the stopband can thus be sufficiently adjusted while preventing deterioration in the characteristics of the low-pass filter 1.

Next, other effects of the present embodiment will be described. In stacking the dielectric layers 51 to 68 to form the stack 50, the capacitor-forming conductor layer 531 is pressed by the through holes to deform slightly. If the amount of deformation of the capacitor-forming conductor layer 531 is large, the capacitances of the capacitors C1 to C3 deviate from their respective desired values. As a result, the low-pass filter 1 can fail to provide desired characteristics.

By contrast, in the present embodiment, the two through hole lines T6 and T7 are connected to the capacitor-forming conductor layer 531. According to the present embodiment, the amount of deformation of the capacitor-forming conductor layer 531 can thus be reduced compared to a case where one through hole line is connected to the capacitor-forming conductor layer 531 like the low-pass filter of the first comparative example. As a result, according to the present embodiment, the capacitances of the capacitors C1 to C3 can be prevented from deviating from their respective desired values.

In the present embodiment, the capacitor-forming conductor layers 541 and 542 not connected to the second inductor-forming conductor layer 551 are interposed between the second inductor-forming conductor layer 551 and the capacitor-forming conductor layer 531. According to the present embodiment, the foregoing layout of the capacitor-forming conductor layers 541 and 542 can reduce the dimension of the stack 50 in the Z direction. The second end of the first portion 551a and the second end of the second portion 551b are connected to each other.

Modification Examples

Figure 13:
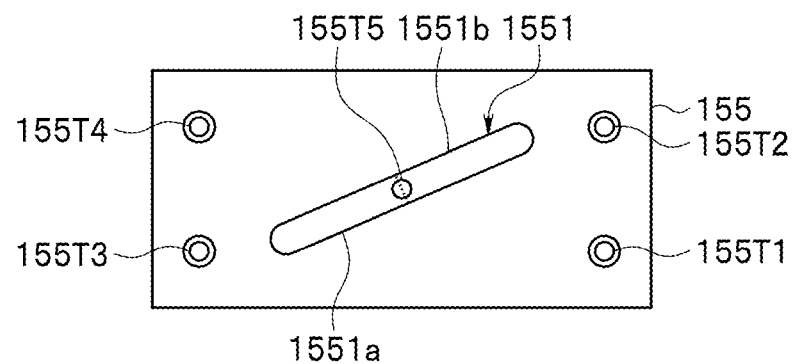
FIG. 13 is an explanatory diagram showing a second inductor-forming conductor layer of a first modification example.

Next, first and second modification examples of the low-pass filter 1 according to the present embodiment will be described. The first modification example will initially be described with reference to FIG. 13. FIG. 13 is an explanatory diagram showing a second inductor-forming conductor layer of the first modification example. The stack 50 in the first modification example includes a dielectric layer 155 shown in FIG. 13 instead of the fifth dielectric layer 55 shown in FIG. 4B. A second inductor-forming conductor layer 1551 is formed on the patterned surface of the dielectric layer 155. The second inductor-forming conductor layer 1551 includes a first portion 1551a and a second portion 1551b. Each of the first and second portions 1551a and 1551b includes a first end and a second end located opposite to each other. The first end of the first portion 1551a and the first end of the second portion 1551b are connected to each other. In FIG. 13, the border between the first portion 1551a and the second portion 1551b is shown by a dotted line.

In the first modification example, the through hole 5416 formed in the dielectric layer 54 (see FIG. 4A) is connected to a portion of the first portion 1551a near the second end thereof. In the first modification example, the through hole 54T7 formed in the dielectric layer 54 (see FIG. 4A) is connected to a portion of the second portion 1551b near the second end thereof.

Further, through holes 155T1, 155T2, 155T3, 155T4, and 155T5 are formed in the dielectric layer 155. The through holes 54T1 to 54T4 formed in the dielectric layer 54 (see FIG. 4A) are connected to the through holes 155T1 to 155T4, respectively. The through hole 155T5 is connected to the first portion 1551a and the second portion 1551b at and near the border between the first portion 1551a and the second portion 1551b. The through holes 155T1 to 155T5 are connected respectively to the through holes 56T1 to 56T5 formed in the dielectric layer 56 shown in FIG. 4C.

The first portion 1551a constitutes the first inductor portion L31 of the third inductor L3 (see FIG. 1). The second portion 1551b constitutes the second inductor portion L32 of the third inductor L3 (see FIG. 1). When seen in one direction (for example, the Z direction) parallel to the stacking direction 1, the second inductor-forming conductor layer 1551 has an axisymmetric shape about an axis of symmetry that passes through the connecting portion of the second inductor-forming conductor layer 1551 and the through hole 155T5 and is orthogonal to the stacking direction T.

Figure 14:
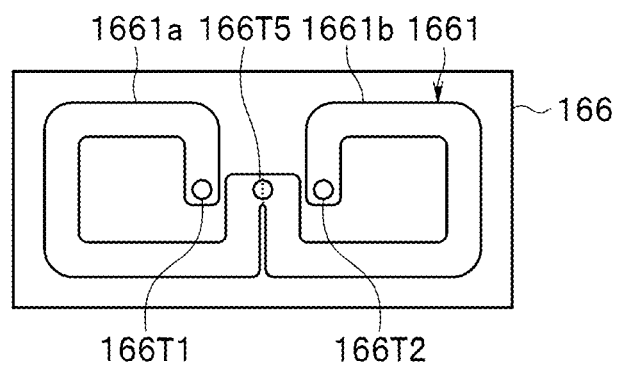
FIG. 14 is an explanatory diagram showing a first inductor-forming conductor layer of a second modification example.

Next, the second modification example will be described with reference to FIG. 14. FIG. 14 is an explanatory diagram showing a first inductor-forming conductor layer of the second modification example. The stack 50 in the second modification example includes a dielectric layer 166 shown in FIG. 14, instead of the sixteenth dielectric layer 66 shown in FIG. 6C. A first inductor-forming conductor layer 1661 is formed on the patterned surface of the dielectric layer 166. The first inductor-forming conductor layer 1661 includes a first portion 1661a and a second portion 1661b. Each of the first and second portions 1661a and 1661b includes a first end and a second end located opposite to each other. The first end of the first portion 1661a and the first end of the second portion 1661b are connected to each other. In FIG. 14, the border between the first portion 1661a and the second portion 1661b is shown by a dotted line.

Further, through holes 166T1, 166T2, and 166T5 are formed in the dielectric layer 166. The through hole 166T1 is connected to a portion of the first portion 1661a near the second end thereof. The through hole 166T2 is connected to a portion of the second portion 1661b near the second end thereof. The through hole 166T5 is connected to the first portion 1661a and the second portion 1661b at and near the border between the first portion 1661a and the second portion 1661b.

In the second modification example, the stack 50 is configured so that the through hole 65T1 formed in the dielectric layer 65 (see FIG. 6B) is connected to a portion of the first portion 1661a near the second end thereof. For example, the through hole 65T1 can be connected to a portion of the first portion 1661a near the second end thereof by adjusting the shape of the conductor layers 631 and 641 (see FIGS. 5C and 6A). Similarly, in the second modification example, the stack 50 is configured so that the through hole 65T2 formed in the dielectric layer 65 (see FIG. 6B) is connected to a portion of the second portion 1661b near the second end thereof. Similarly, in the second modification example, the stack 50 is configured so that the through hole 65T5 formed in the dielectric layer 65 (see FIG. 6B) is connected to the first portion 1661a and the second portion 1661b at and near the border between the first portion 1661a and the second portion 1661b.

Although not shown in the drawings, the stack 50 in the second modification example includes a dielectric layer on which a first inductor-forming conductor layer having the same shape as that of the first inductor-forming conductor layer 1661 is formed, instead of the seventeenth dielectric layer 67 shown in FIG. 7A. The through hole 166T1 formed in the dielectric layer 166 is connected to a portion of the first portion of the not-shown first inductor-forming conductor layer near the second end thereof. The through hole 166T2 formed in the dielectric layer 166 is connected to a portion of the second portion of the not-shown first inductor-forming conductor layer near the second end thereof. The through hole 166T5 formed in the dielectric layer 166 is connected to the first portion and the second portion of the not-shown first inductor-forming conductor layer at and near the border between the first portion and the second portion of the not-shown first inductor-forming conductor layer.

The first portion 1661a of the first inductor-forming conductor layer 1661 and the first portion of the not-shown first inductor-forming conductor layer constitute the first inductor L1 (see FIG. 1). The second portion 1661b of the first inductor-forming conductor layer 1661 and the second portion of the not-shown first inductor-forming conductor layer constitute the second inductor L2 (see FIG. 1). When seen in one direction (for example, the Z direction) parallel to the stacking direction T, the first inductor-forming conductor layer 1661 has an axisymmetric shape about an axis of symmetry that passes through the connecting portion of the first inductor-forming conductor layer 1661 and the through hole 65T5 and is orthogonal to the stacking direction T. In particular, in the second modification example, the axis of symmetry is parallel to the vertical direction in FIG. 14. The not-shown first inductor-forming conductor layer has the same axisymmetric shape as that of the first inductor-forming conductor layer 1661.

Second Embodiment

A second embodiment of the invention will now be described. A low-pass filter 1 according to the present embodiment has the same circuit configuration as that of the low-pass filter 1 according to the first embodiment described with reference to FIG. 1. Like the low-pass filter 1 according to the first embodiment, the low-pass filter 1 according to the present embodiment includes the stack 50 and terminals 111 to 116 shown in FIG. 2.

The stack 50 of the present embodiment includes seventeen dielectric layers stacked together, instead of the dielectric layers 51 to 68 of the first embodiment. The seventeen dielectric layers will be referred to as a first to a seventeenth dielectric layer in the order from bottom to top. The first to seventeenth dielectric layers are denoted by reference numerals 71 to 87, respectively.

Figure 15A:
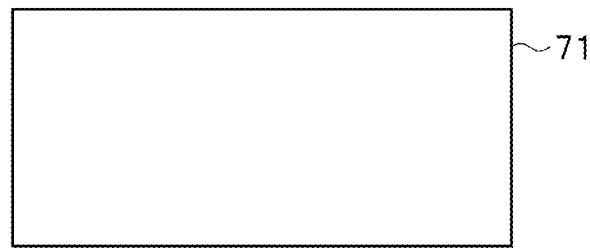
FIG. 15A to FIG. 15C are explanatory diagrams showing respective patterned surfaces of first to third dielectric layers of a stack of a multilayered low-pass filter according to a second embodiment of the invention.

FIG. 15A shows the patterned surface of the first dielectric layer 71. No conductor layers or through holes are formed on/in the dielectric layer 71.

Figure 15B:
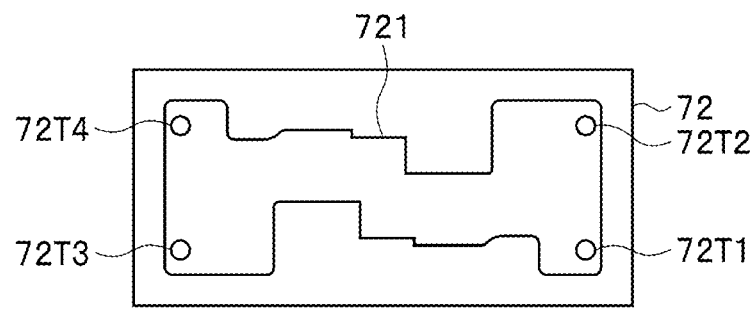

FIG. 15B shows the patterned surface of the second dielectric layer 72. A capacitor-forming conductor layer 721 is formed on the patterned surface of the dielectric layer 72. Further, through holes 72T1, 72T2, 72T3, and 72T4 are formed in the dielectric layer 72. The through holes 72T1 to 72T4 are connected to the conductor layer 721.

Figure 15C:
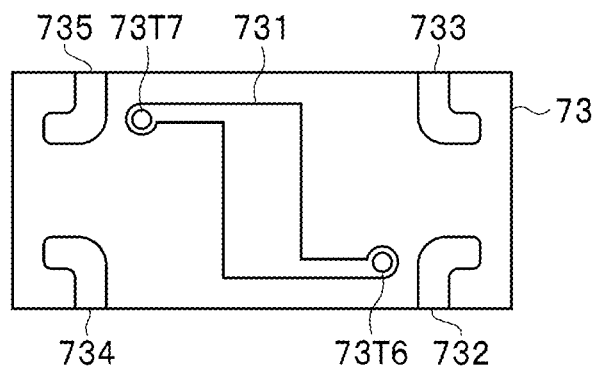

FIG. 15C shows the patterned surface of the third dielectric layer 73. A capacitor-forming conductor layer 731 and conductor layers 732, 733, 734, and 735 are formed on the patterned surface of the dielectric layer 73. The conductor layers 732, 733, 734, and 735 are connected to the terminals 111, 114, 113, and 116 (see FIG. 2), respectively. The through holes 72T1 to 72T4 formed in the dielectric layer 72 are connected to the conductor layers 732 to 735, respectively. Further, through holes 73T6 and 73T7 are formed in the dielectric layer 73. The through holes 73T6 and 73T7 are connected to the conductor layer 731.

Figure 16A:
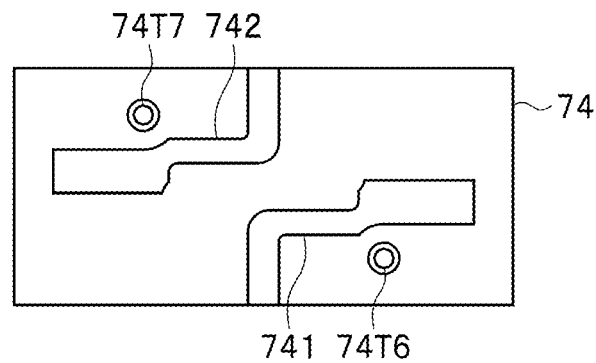
FIG. 16A and FIG. 16B are explanatory diagrams showing respective patterned surfaces of fourth and fifth dielectric layers of the stack of the multilayered low-pass filter according to the second embodiment of the invention.

FIG. 16A shows the patterned surface of the fourth dielectric layer 74. Capacitor-forming conductor layers 741 and 742 are formed on the patterned surface of the dielectric layer 74. The conductor layer 741 is connected to the terminal 112 (see FIG. 2). The conductor layer 742 is connected to the terminal 115 (see FIG. 2). Further, through holes 74T6 and 74T7 are formed in the dielectric layer 74. The through holes 73T6 and 73T7 formed in the dielectric layer 73 are connected to the through holes 74T6 and 74T7, respectively.

Figure 16B:
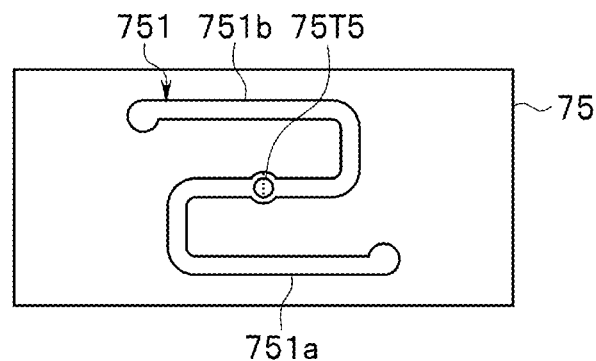

FIG. 16B shows the patterned surface of the fifth dielectric layer 75. A second inductor-forming conductor layer 751 is formed on the patterned surface of the dielectric layer 75. The second inductor-forming conductor layer 751 includes a first portion 751a and a second portion 751b. Each of the first and second portions 751a and 751b has a first end and a second end located opposite to each other. The first end of the first portion 751a and the first end of the second portion 751b are connected to each other. In FIG. 16B, the border between the first portion 751a and the second portion 751b is shown by a dotted line. The through hole 74T6 formed in the dielectric layer 74 is connected to a portion of the first portion 751a near the second end thereof. The through hole 74T7 formed in the dielectric layer 74 is connected to a portion of the second portion 751b near the second end thereof.

Further, a through hole 75T5 is formed in the dielectric layer 75. The through hole 75T5 is connected to the first portion 751a and the second portion 751b at and near the border between the first portion 751a and the second portion 751b.

Figure 16C:
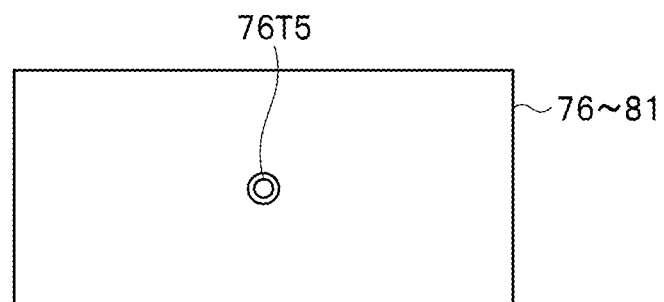
FIG. 16C is an explanatory diagram showing a patterned surface of each of sixth to eleventh dielectric layers of the stack of the multilayered low-pass filter according to the second embodiment of the invention.

FIG. 16C shows a patterned surface of each of the sixth to eleventh dielectric layers 76 to 81. In each of the dielectric layers 76 to 81, there is formed a through hole 76T5. The through hole 75T5 formed in the dielectric layer 75 is connected to the through hole 76T5 formed in the dielectric layer 76. In the dielectric layers 76 to 81, the vertically adjacent through holes 76T5 are connected to each other.

Figure 17A:
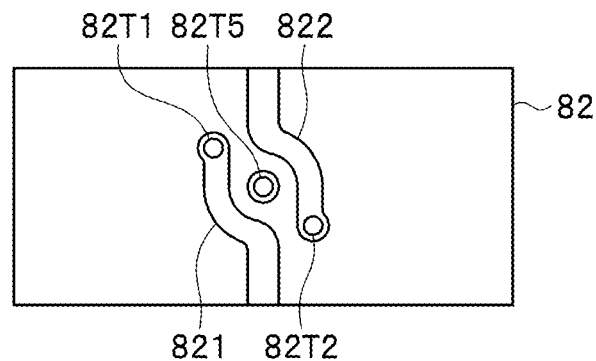
FIG. 17A to FIG. 17C are explanatory diagrams showing respective patterned surfaces of twelfth to fourteenth dielectric layers of the stack of the multilayered low-pass filter according to the second embodiment of the invention.

FIG. 17A shows the patterned surface of the twelfth dielectric layer 82. Inductor-forming conductor layers 821 and 822 are formed on the patterned surface of the dielectric layer 82. Each of the conductor layers 821 and 822 has a first end and a second end opposite to each other. The first end of the conductor layer 821 is connected to the terminal 112 (see FIG. 2). The first end of the conductor layer 822 is connected to the terminal 115 (see FIG. 2). Further, through holes 82T1, 82T2, and 82T5 are formed in the dielectric layer 82. The through hole 82T1 is connected to a portion of the conductor layer 821 near the second end thereof. The through hole 82T2 is connected to a portion of the conductor layer 822 near the second end thereof. The through hole 76T5 formed in the dielectric layer 81 is connected to the through hole 82T5.

Figure 17B:
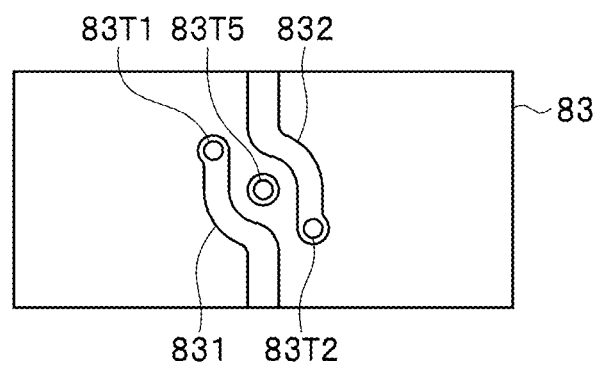

FIG. 17B shows the patterned surface of the thirteenth dielectric layer 83. Inductor-forming conductor layers 831 and 832 are formed on the patterned surface of the dielectric layer 83. Each of the conductor layers 831 and 832 has a first end and a second end opposite to each other. The first end of the conductor layer 831 is connected to the terminal 112 (see FIG. 2). The first end of the conductor layer 832 is connected to the terminal 115 (see FIG. 2). Further, through holes 83T1, 83T2, and 83T5 are formed in the dielectric layer 83. The through hole 82T1 formed in the dielectric layer 82 and the through hole 83T1 is connected to a portion of the conductor layer 831 near the second end thereof. The through hole 82T2 formed in the dielectric layer 82 and through hole 83T2 is connected to a portion of the conductor layer 832 near the second end thereof. The through hole 82T5 formed in the dielectric layer 82 is connected to the through hole 83T5.

Figure 17C:
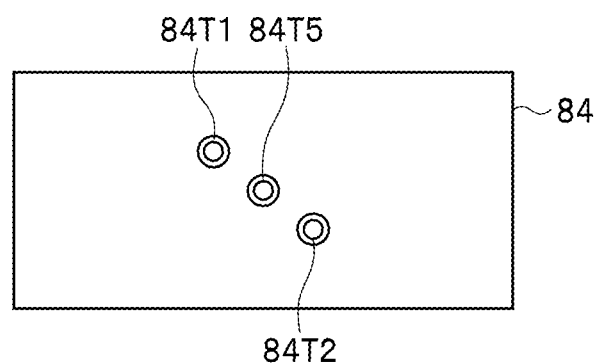

FIG. 17C shows the patterned surface of the fourteenth dielectric layer 84. Through holes 84T1, 84T2, and 84T5 are formed in the dielectric layer 84. The through holes 83T1, 83T2, and 83T5 formed in the dielectric layer 83 are connected to the through holes 84T1, 84T2, and 84T5, respectively.

Figure 18A:
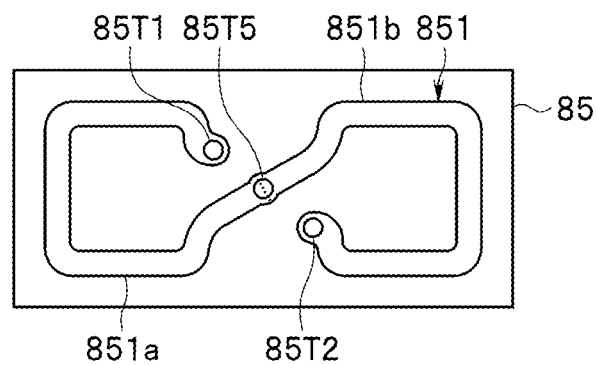
FIG. 18A to FIG. 18C are explanatory diagrams showing respective patterned surfaces of fifteenth to seventeenth dielectric layers of the stack of the multilayered low-pass filter according to the second embodiment of the invention.

FIG. 18A shows the patterned surface of the fifteenth dielectric layer 85. A first inductor-forming conductor layer 851 is formed on the patterned surface of the dielectric layer 85. The first inductor-forming conductor layer 851 includes a first portion 851a and a second portion 851b. Each of the first and second portions 851a and 851b has a first end and a second end located opposite to each other. The first end of the first portion 851a and the first end of the second portion 851b are connected to each other. In FIG. 18A, the border between the first portion 851a and the second portion 851b is shown by a dotted line.

Further, through holes 85T1, 85T2, and 85T5 are formed in the dielectric layer 85. The through hole 84T1 formed in the dielectric layer 84 and the through hole 85T1 are connected to a portion of the first portion 851a near the second end thereof. The through hole 84T2 formed in the dielectric layer 84 and the through hole 85T2 are connected to a portion of the second portion 851b near the second end thereof. The through hole 84T5 formed in the dielectric layer 84 and the through hole 85T5 are connected to the first portion 851a and the second portion 851b at and near the border between the first portion 851a and the second portion 851b.

Figure 18B:
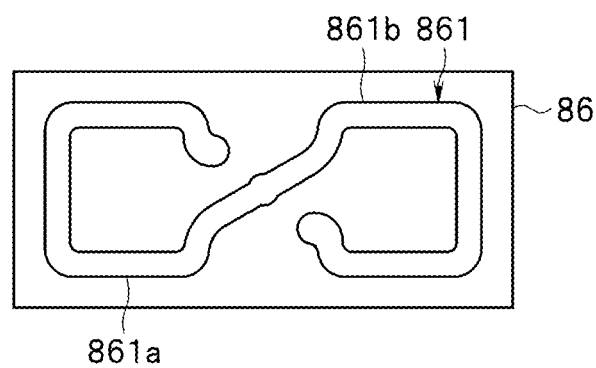

FIG. 18B shows the patterned surface of the sixteenth dielectric layer 86. A first inductor-forming conductor layer 861 is formed on the patterned surface of the dielectric layer 86. The first inductor-forming conductor layer 861 includes a first portion 861a and a second portion 861b. Each of the first and second portions 861a and 861b has a first end and a second end located opposite to each other. The second end of the first portion 861a and the second end of the second portion 861b are connected to each other. In FIG. 18B, the border between the first portion 861a and the second portion 861b is shown by a dotted line.

The through hole 85T1 formed in the dielectric layer 85 is connected to a portion of the first portion 861a near the second end thereof. The through hole 85T2 formed in the dielectric layer 85 is connected to a portion of the second portion 861b near the second end thereof. The through hole 85T5 formed in the dielectric layer 85 is connected to the first portion 861a and the second portion 861b at and near the border between the first portion 861a and the second portion 861b.

Figure 18C:
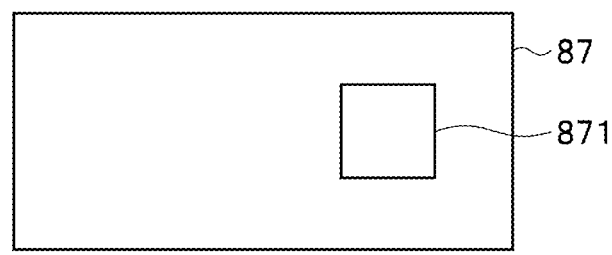

FIG. 18C shows the patterned surface of the seventeenth dielectric layer 87. A mark 871 made of a conductor layer is formed on the patterned surface of the dielectric layer 87.

The stack 50 of the present embodiment (see FIG. 2) is thrmed by stacking the first to seventeenth dielectric layers 71 to 87 such that the patterned surface of the first dielectric layer 71 serves as the bottom surface 50A of the stack 50 and the surface of the seventeenth dielectric layer 87 opposite to the patterned surface thereof serves as the top surface 50B of the stack 50.

Figure 19:
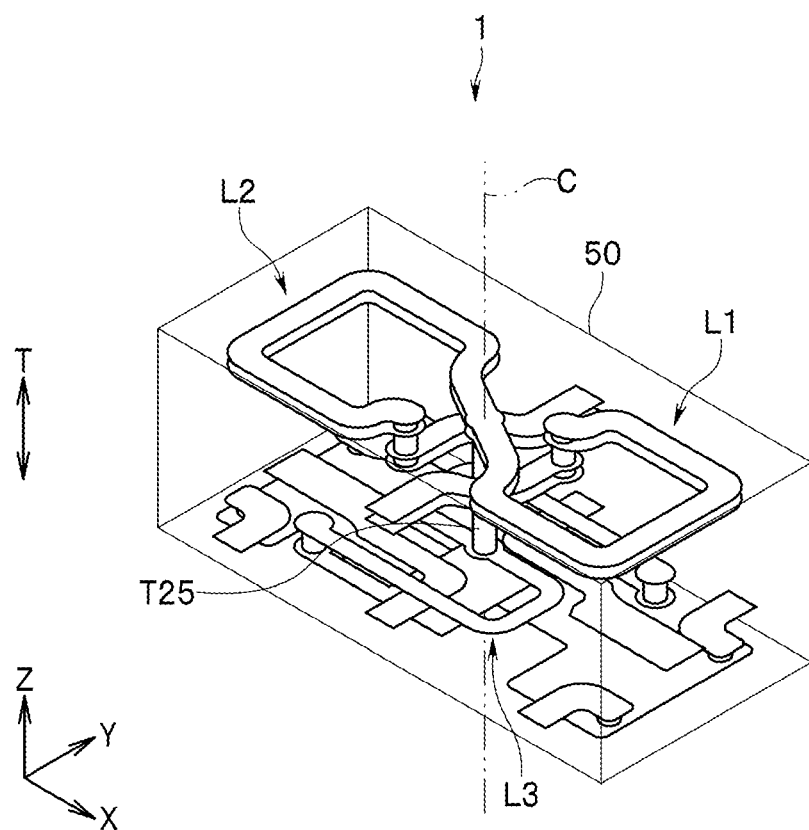
FIG. 19 is an internal perspective view showing the stack of the multilayered low-pass filter according to the second embodiment of the invention.
Figure 20:
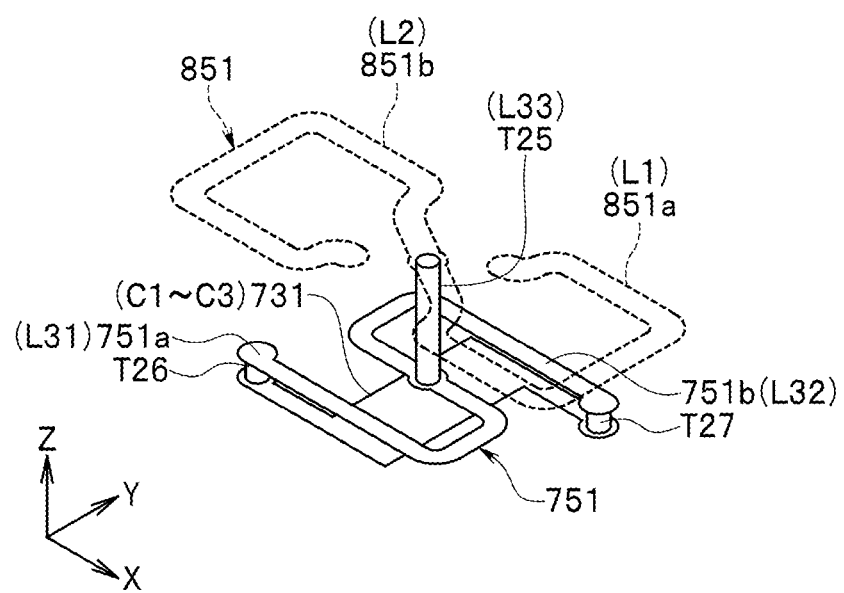
FIG. 20 is an internal perspective view showing a part of the stack shown in FIG. 19.

FIG. 19 shows the inside of the stack 50 formed by stacking the first to seventeenth dielectric layers 71 to 87. As shown in FIG. 19, the plurality of conductor layers and the plurality of through holes shown in FIGS. 15A to 18C are stacked inside the stack 50. In FIG. 19, the mark 871 is omitted. FIG. 20 shows a part of the inside of the stack 50 shown in FIG. 19. Specifically, FIG. 20 shows the first inductor-font ling conductor layer 851, the second inductor-forming conductor layer 751, and the capacitor-forming conductor layer 731, and through holes connecting the conductor layers.

Correspondences between the circuit components of the low-pass filter 1 shown in FIG. 1 and the internal components of the stack 50 shown in FIG. 15A to FIG. 18C will now be described. The first inductor L1 is composed of the first portion 851a of the first inductor-forming conductor layer 851 shown in FIG. 18A, the first portion 861a of the first inductor-forming conductor layer 861 shown in FIG. 18B, and the through holes 85T1 and 85T5.

The second inductor L2 is composed of the second portion 851b of the first inductor-forming conductor layer 851 shown in FIG. 18A, the second portion 861b of the first inductor-forming conductor layer 861 shown in FIG. 18B, and the through holes 85T2 and 85T5.

The first inductor portion L31 of the third inductor L3 is composed of the first portion 751a of the conductor layer 751 shown in FIG. 16B. The second inductor portion L32 of the third inductor L3 is composed of the second portion 751b of the conductor layer 751 shown in FIG. 16B. The third inductor portion L33 of the third inductor L3 is composed of the through holes 75T5, 76T5, 82T5, 83T5, and 84T5 shown in FIGS. 16B to 17C.

The inductor L4 is composed of the inductor-forming conductor layers 821 and 831 shown in FIG. 17A and FIG. 17B and the through hole 82T1. The inductor L5 is composed of the inductor-forming conductor layers 822 and 832 shown in FIG. 17A and FIG. 17B and the through hole 82T2.

The inductor L6 is composed of the conductor layer 732 shown in FIG. 15C and the through hole 72T1 shown in FIG. 15B. The inductor L7 is composed of the conductor layer 733 shown in FIG. 15C and the through hole 72T2 shown in FIG. 15B. The inductor L8 is composed of the conductor layer 734 shown in FIG. 15C and the through hole 72T3 shown in FIG. 15B. The inductor L9 is composed of the conductor layer 735 shown in FIG. 15C and the through hole 72T4 shown in FIG. 15B.

The capacitor C1 is composed of the capacitor-forming conductor layers 721 and 731 shown in FIG. 15B and FIG. 15C, and the dielectric layer 72 interposed between those conductor layers.

The capacitor C2 is composed of the capacitor-forming conductor layers 731 and 741 shown in FIG. 15C and FIG. 16A, and the dielectric layer 73 interposed between those conductor layers. The capacitor C3 is composed of the capacitor-forming conductor layers 731 and 742 shown in FIG. 15C and FIG. 16A, and the dielectric layer 73 interposed between those conductor layers.

The capacitor C4 is composed of the capacitor-forming conductor layers 721 and 741 shown in FIG. 15B and FIG. 16A, and the dielectric layers 72 and 73 each interposed between those conductor layers. The capacitor C5 is composed of the capacitor-forming conductor layers 721 and 742 shown in FIG. 15B and FIG. 16A, and the dielectric layers 72 and 73 each interposed between those conductor layers.

The capacitor C6 is composed of the capacitor-forming conductor layer 721 and the dielectric layers 732 to 735 shown in FIGS. 15B and 15C, and the dielectric layers 72 between two of those conductor layers.

Next, structural features of the low-pass filter 1 according to the present embodiment will be described with reference to FIGS. 15A to 20. The plurality of conductor layers of the stack 50 include the first inductor-forming conductor layer 851, the second inductor-forming conductor layer 751, and the capacitor-forming conductor layer 731 located at different positions, respectively, in the stacking direction T. The first inductor-forming conductor layer 851 constitutes at least a part of each of the first and second inductors L1 and L2. The second inductor-forming conductor layer 751 includes the first portion 751a constituting a part of the first inductor portion L31, and the second portion 751b constituting a part of the second inductor portion L32. The capacitor-forming conductor layer 731 constitutes a part of each of the capacitors C1 to C3.

The first inductor-firming conductor layer 851 and the second inductor-forming conductor layer 751 are connected by a through hole line T25 composed of the through holes 75T5, 76T5, 82T5, 83T5, and 84T5 (first through holes) connected in series. The first portion 751a and the capacitor-forming conductor layer 731 are connected by a through hole line T26 composed of the through holes 73T6 and 74T6 (second through holes) connected in series. The second portion 751b and the capacitor-forming conductor layer 731 are connected by a through hole line T27 composed of the through holes 73T7 and 74T7 (third through holes) connected in series.

The second inductor-forming conductor layer 751 has a shape to match itself when seen in one direction (for example, the Z direction) parallel to the stacking direction T and rotated by 180° about a center axis that passes through the connecting portion of the second inductor-forming conductor layer 751 and the through hole 75T5 and is parallel to the stacking direction T. The first portion 751a and the second portion 751b have a shape to match each other when seen in the Z direction and rotated by 180° about the center axis. The through hole line T26 and the through hole line T27 are located symmetrically about the connecting portion.

The first inductor-forming conductor layer 851 has a shape to match itself when seen in the Z direction and rotated by 180° about a center axis that passes through the connecting portion of the through hole 84T5 and the first inductor-forming conductor layer 851 and is parallel to the stacking direction T. The first portion 851a and the second portion 851b have a shape to match each other when seen in the Z direction and rotated by 180° about the center axis.

The first inductor-forming conductor layer 861 has the same shape as that of the first inductor-forming conductor layer 851. The first inductor-forming conductor layer 861 thus has a rotationally symmetric shape like that of the first inductor-forming conductor layer 851.

In FIG. 19 the straight line denoted by the symbol C represents a center axis that intersects the through holes 75T5, 76T5, 82T5, 83T5, and 84T5 (the first through holes), the center axis being parallel to the stacking direction T. When seen in the Z direction, the position of the center axis C matches each of the positions of the centers of gravity of the respective dielectric layers 71 to 87. Each of the conductor layers included in the stack 50, not limited to the first inductor-forming conductor layers 851 and 861 and the second inductor-forming conductor layer 751, has a shape to match itself or another conductor layer when seen in the Z direction and rotated by $180^0$ about the center axis C. Each of the through holes included in the stack 50 is located to match itself or another through hole when seen in the Z direction and rotated by 180° about the center axis C.

As shown in FIGS. 15C to 16B, the capacitor-forming conductor layers 741 and 742 are interposed between the second inductor-forming conductor layer 751 and the capacitor-forming conductor layer 731. When seen in the Z direction, the second inductor-forming conductor layer 751 overlaps each of the capacitor-forming conductor layers 741 and 742.

The configuration, function and effects of the present embodiment are otherwise the same as those of the first embodiment.

[Simulation]

Next, an example of characteristics of each of the low-pass filters 1 according to the first and second embodiments, determined by simulation will be described. The simulation used a first model and a second model. The first model is a model corresponding to the low-pass filter 1 according to the first embodiment. The second model is a model corresponding to the low-pass filter 1 according to the second embodiment.

Figure 21:
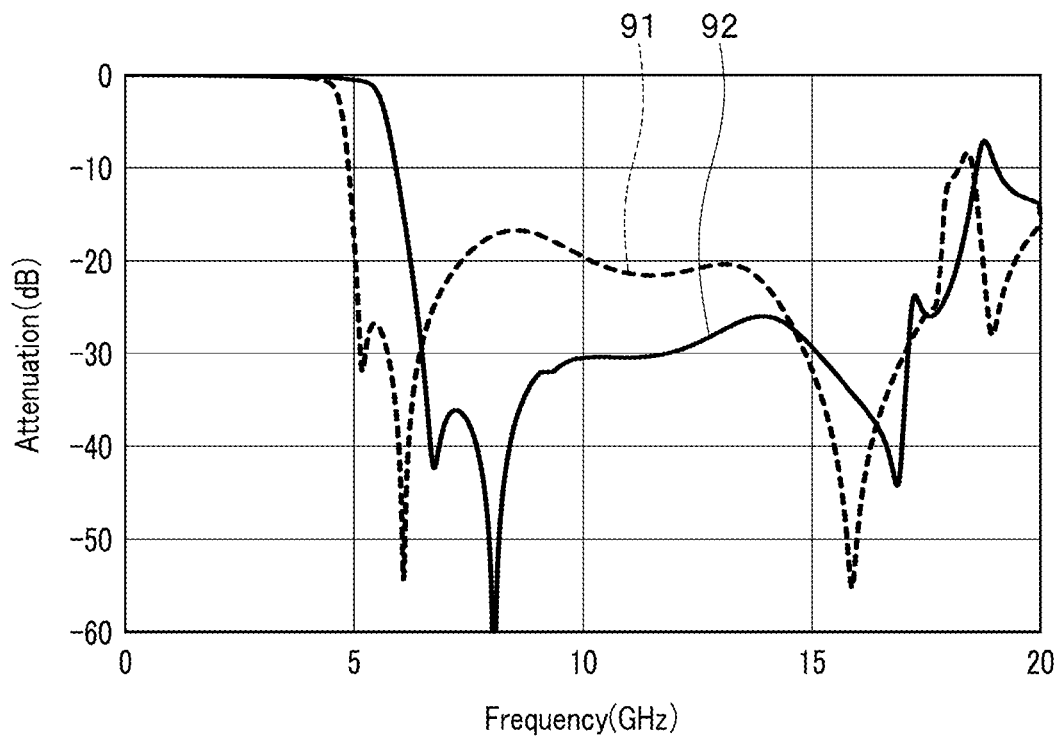
FIG. 21 is a characteristic chart showing a pass characteristic of each of first and second models.
Figure 22:
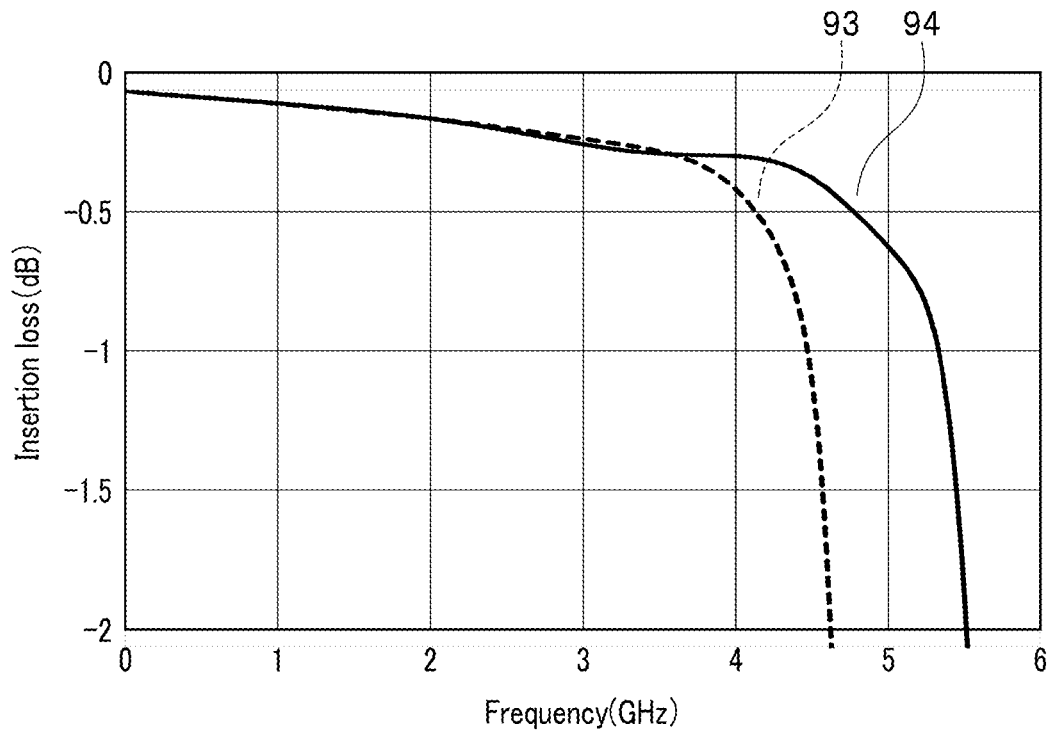
FIG. 22 is a characteristic chart showing an insertion loss of each of the first and second models.
Figure 23:
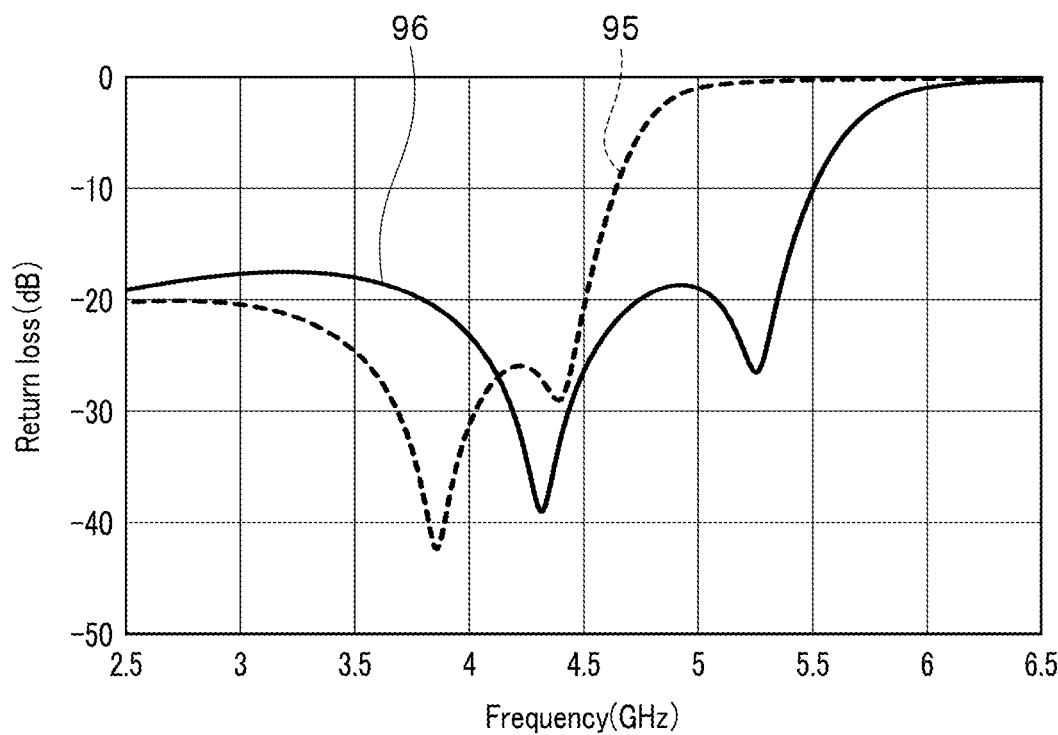
FIG. 23 is a characteristic chart showing return loss at a first input/output port of each of the first and second models.
Figure 24:
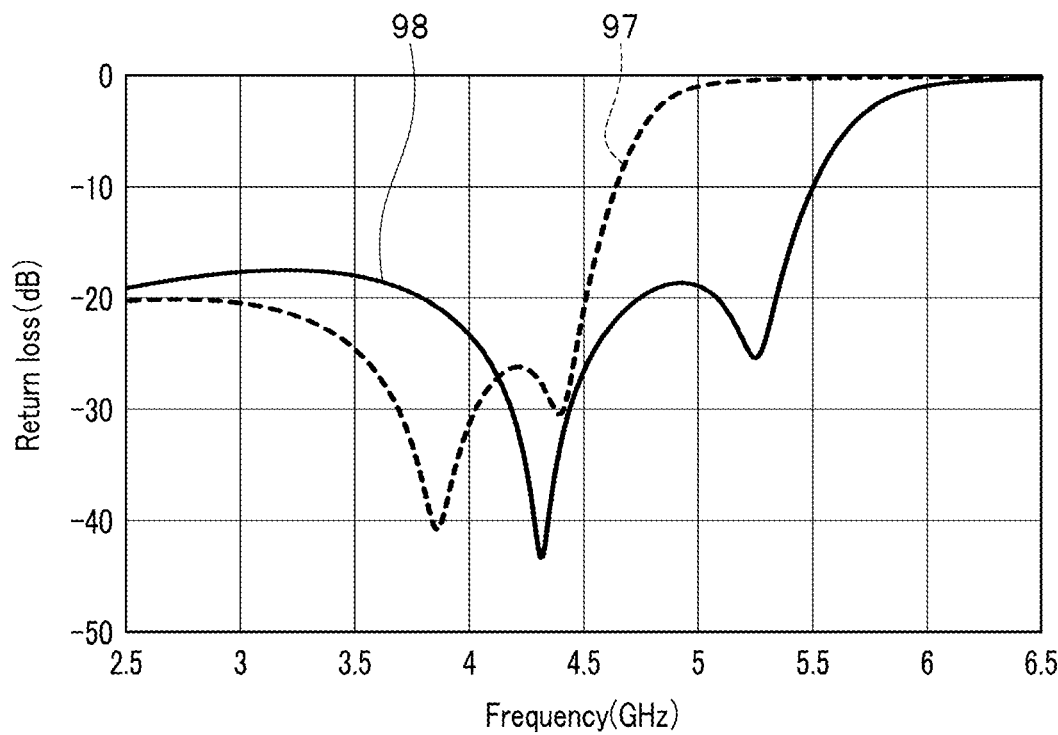
FIG. 24 is a characteristic chart showing return loss at a second input/output port of each of the first and second models.

FIG. 21 is a characteristic chart showing a pass characteristic of each of the first and second models. FIG. 22 is a characteristic chart showing insertion loss of each of the first and second models. FIG. 23 is a characteristic chart showing return loss at the first input/output port 2 (see FIG. 1) of each of the first and second models. FIG. 24 is a characteristic chart showing return loss at the second input/output port 3 (see FIG. 1) of each of the first and second models. In FIGS. 21 to 24, the horizontal axis indicates frequency. In FIG. 21, the vertical axis indicates an attenuation. In FIG. 22, the vertical axis indicates the insertion loss. In each of FIGS. 23 and 24, the vertical axis indicates the return loss.

In FIG. 21, the curve denoted by the reference numeral 91 represents the pass characteristic of the first model, and the curve denoted by the reference numeral 92 the pass characteristic of the second model. In FIG. 22, the curve denoted by the reference numeral 93 represents the insertion loss of the first model, and the curve denoted by the reference numeral 94 the insertion loss of the second model. In FIG. 23, the curve denoted by the reference numeral 95 represents the return loss of the first model, and the curve denoted by the reference numeral 96 the return loss of the second model. In FIG. 24, the curve denoted by the reference numeral 97 represents the return loss of the first model, and the curve denoted by the reference numeral 98 the return loss of the second model.

As shown in FIG. 21, each of the first and second models showed two attenuation poles in the stopband near the cutoff frequency. The frequencies of the two attenuation poles are adjusted mainly by using the third inductor L3. In the first and second models, the second inductor-forming conductor layers constituting the first and second inductor portions L31 and L32 of the third inductor L3 have different shapes. From the result of the simulation, it can be seen that the attenuation poles can be adjusted and the insertion loss in the stopband can be adjusted as well by adjusting the shape of the second inductor-forming conductor layer.

The present invention is not limited to the foregoing embodiments, and various modifications may be made thereto. For example, the configuration of the multilayered low-pass filter according to the present invention and the shapes of the inductor-forming conductor layers and the capacitor-forming conductor layers are not limited to the examples described in the embodiments and may be optional as long as the requirements set forth in the claims are satisfied.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A multilayered low-pass filter comprising:
a first inductor and a second inductor connected in series;
a third inductor provided between a connection point of the first inductor with the second inductor and a ground in a circuit configuration;
a capacitor connected to the third inductor; and
a stack including a plurality of dielectric layers and a plurality of conductor layers stacked together, the stack being intended to integrate the first inductor, the second inductor, the third inductor, and the capacitor, wherein
the third inductor includes a first inductor portion and a second inductor portion connected in parallel,
the plurality of conductor layers include a first inductor-forming conductor layer, a second inductor-forming conductor layer, and a capacitor-forming conductor layer located at different positions, respectively, in a stacking direction of the plurality of dielectric layers,
the first inductor-forming conductor layer constitutes at least a part of each of the first and second inductors,
the second inductor-forming conductor layer includes a first portion constituting the first inductor portion and a second portion constituting the second inductor portion,
the capacitor-forming conductor layer constitutes a part of the capacitor,
the stack further includes at least one first through hole connecting the first inductor-forming conductor layer and the second inductor-forming conductor layer, at least one second through hole connecting the first portion of the second inductor-forming conductor layer and the capacitor-forming conductor layer, and at least one third through hole connecting the second portion of the second inductor-forming conductor layer and the capacitor-forming conductor layer.

2. The multilayered low-pass filter according to claim 1, wherein:
the third inductor further includes a third inductor portion provided between the connection point and the first and second inductor portions in the circuit configuration; and
the third inductor portion includes the at least one first through hole.

3. The multilayered low-pass filter according to claim 1, wherein the at least one first through hole includes a plurality of first through holes connected in series.

4. The multilayered low-pass filter according to claim 1, wherein the second inductor-forming conductor layer has a rotationally symmetric shape about a connecting portion of the second inductor-forming conductor layer and the at least one first through hole when seen in one direction parallel to the stacking direction.

5. The multilayered low-pass filter according to claim 4, wherein the at least one second through hole and the at least one third through hole are located symmetrically about the connecting portion when seen in the one direction parallel to the stacking direction.

6. The multilayered low-pass filter according to claim 1, wherein the second inductor-forming conductor layer has an axisymmetric shape about an axis of symmetry passing through a connecting portion of the second inductor-forming conductor layer and the at least one first through hole when seen in one direction parallel to the stacking direction, the axis of symmetry being orthogonal to the stacking direction.

7. The multilayered low-pass filter according to claim 6, wherein the at least one second through hole and the at least one third through hole are located symmetrically about the connecting portion when seen in the one direction parallel to the stacking direction.

8. The multilayered low-pass filter according to claim 1, wherein the first inductor-forming conductor layer has a rotationally symmetric shape about a connecting portion of the first inductor-forming conductor layer and the at least one first through hole when seen in one direction parallel to the stacking direction.

9. The multilayered low-pass filter according to claim 1, wherein the first inductor-forming conductor layer has an axisymmetric shape about an axis of symmetry passing through a connecting portion of the first inductor-forming conductor layer and the at least one first through hole when seen in one direction parallel to the stacking direction, the axis of symmetry being orthogonal to the stacking direction.

10. The multilayered low-pass filter according to claim 1, wherein each of the plurality of conductor layers has a shape to match itself or another conductor layer when rotated about a center axis intersecting the at least one first through hole, the center axis being parallel to the stacking direction.

11. The multilayered low-pass filter according to claim 10, wherein:
the stack further includes a plurality of through holes including the at least one first through hole, the at least one second through hole, and the at least one third through hole; and
each of the plurality of through holes is located at a position to match itself or another through hole when seen in one direction parallel to the stacking direction and rotated about the center axis.

* * * * *